United States Patent
Zou et al.

(10) Patent No.: US 12,395,076 B2
(45) Date of Patent: Aug. 19, 2025

(54) CHARGE PUMP CELL WITH IMPROVED LATCH-UP IMMUNITY AND CHARGE PUMPS INCLUDING THE SAME, AND RELATED SYSTEMS, METHODS AND DEVICES

(71) Applicant: Microchip Technology Incorporated, Chandler, AZ (US)

(72) Inventors: Lei Zou, Langhus (NO); Torbjoern Loevseth Finnoey, Trøndelag (NO)

(73) Assignee: Microchip Technology Incorporated, Chandler, AZ (US)

(*) Notice: Subject to any disclaimer, the term of this patent is extended or adjusted under 35 U.S.C. 154(b) by 0 days.

(21) Appl. No.: 18/152,032

(22) Filed: Jan. 9, 2023

(65) Prior Publication Data

US 2023/0231474 A1    Jul. 20, 2023

Related U.S. Application Data

(62) Division of application No. 17/318,596, filed on May 12, 2021, now Pat. No. 11,552,559.

(60) Provisional application No. 63/026,435, filed on May 18, 2020.

(51) Int. Cl.
    *H02M 3/07*    (2006.01)

(52) U.S. Cl.
    CPC .................... *H02M 3/07* (2013.01)

(58) Field of Classification Search
    CPC ..... H02M 3/07; H03K 17/162; H03K 17/165; H03K 17/30; H03K 17/145; H03K 2217/0018
    See application file for complete search history.

(56) References Cited

U.S. PATENT DOCUMENTS

| | | |
|---|---|---|
| 8,130,028 B2 | 3/2012 | Park et al. |
| 10,491,114 B1 * | 11/2019 | Zhang ................. G05F 1/462 |
| 11,073,857 B1 | 7/2021 | Liberti et al. |
| 2004/0004851 A1 | 1/2004 | Itoh |

(Continued)

FOREIGN PATENT DOCUMENTS

| | | |
|---|---|---|
| CN | 101667774 B | 5/2012 |
| JP | 2003-347913 A | 12/2003 |

(Continued)

OTHER PUBLICATIONS

Request for the Submission of an Opinion of Korean Patent Application No. 10-2022-7041573, issued Feb. 26, 2024, 16 pages with English translation.

(Continued)

Primary Examiner — Sibin Chen
(74) Attorney, Agent, or Firm — TraskBritt

(57) ABSTRACT

A charge pump cell for a charge pump is disclosed that may exhibit improved latch-up immunity. A circuit may be arranged at the charge pump cell to apply a voltage to a bulk contact of a charge transfer transistor of such a charge pump cell at least partially responsive to a relationship between a voltage at a first terminal of the charge transfer transistor and a voltage at a second terminal of the charge transfer transistor. A charge pump including one or more such charge pump cells may include a control loop that is configured to control a pumping signal at least partially responsive to a state of an output voltage of the charge pump.

25 Claims, 13 Drawing Sheets

(56) References Cited

U.S. PATENT DOCUMENTS

| | | |
|---|---|---|
| 2004/0070441 A1 | 4/2004 | Bringivijayaraghavan |
| 2006/0109048 A1* | 5/2006 | Mensi .................. G05F 1/10 327/536 |
| 2007/0096796 A1* | 5/2007 | Firmansyah ............ H02M 3/07 327/536 |
| 2008/0246536 A1 | 10/2008 | Chang et al. |
| 2009/0009237 A1 | 1/2009 | Ootani |
| 2010/0207684 A1 | 8/2010 | Park et al. |
| 2013/0321069 A1* | 12/2013 | Yajima ................... H02M 3/07 327/536 |
| 2019/0317140 A1 | 10/2019 | Tang et al. |
| 2021/0203221 A1 | 7/2021 | Lilic et al. |
| 2021/0281172 A1* | 9/2021 | Rana ................... H02M 3/073 |

FOREIGN PATENT DOCUMENTS

| | | |
|---|---|---|
| JP | 2007-243940 A | 9/2007 |
| JP | 2013-021817 A | 1/2013 |
| JP | 2019-092303 A | 6/2019 |
| KR | 10-2009-0060678 A | 6/2009 |
| TW | 200301562 A | 7/2003 |
| WO | 2019/219295 A1 | 11/2019 |

OTHER PUBLICATIONS

International Search Report from International Application No. PCT/US2021/031992, mailed Aug. 26, 2021, 4 pages.
International Written Opinion from International Application No. PCT/US2021/031992, mailed Aug. 26, 2021, 8 pages.
Office Action and Search Report of Taiwan Patent Application No. 110117617, issued Nov. 11, 2024, 8 pages with English translation.
Request for the Submission of an Opinion of Korean Patent Application No. 10-2022-7041573, issued Oct. 15, 2024, 9 pages with English translation.
Notice of Refusal of Japanese Patent Application No. 2022-570153, mailed Jun. 10, 2025, 12 pages with English translation.
Request for the Submission of an Opinion of Korean Patent Application No. 10-2022-7041573, issued Apr. 24, 2025, 6 pages with English translation.

* cited by examiner

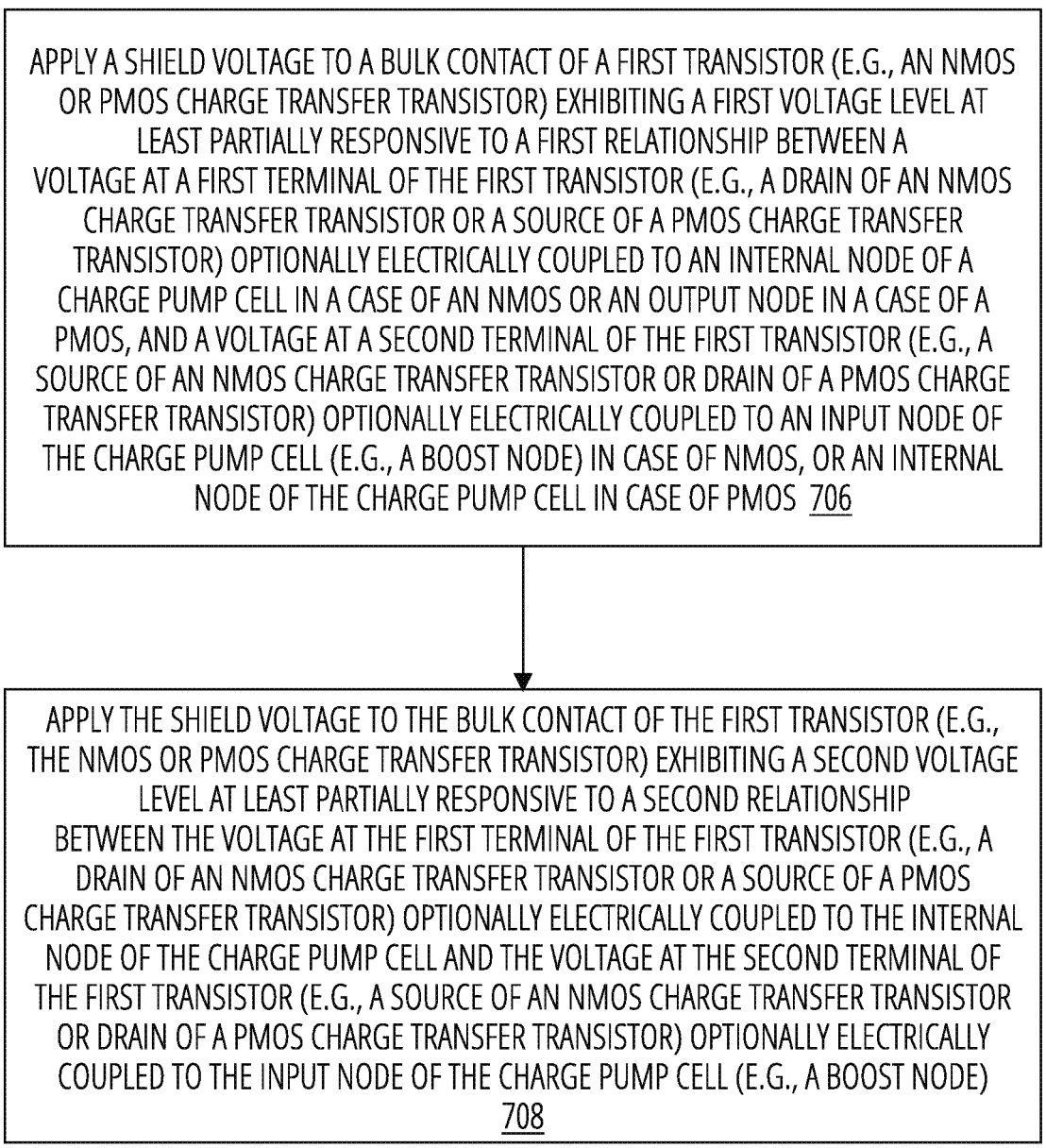

APPLY A SHIELD VOLTAGE TO A BULK CONTACT OF A FIRST TRANSISTOR (E.G., AN NMOS OR PMOS CHARGE TRANSFER TRANSISTOR) EXHIBITING A FIRST VOLTAGE LEVEL AT LEAST PARTIALLY RESPONSIVE TO A FIRST RELATIONSHIP BETWEEN A VOLTAGE AT A FIRST TERMINAL OF THE FIRST TRANSISTOR (E.G., A DRAIN OF AN NMOS CHARGE TRANSFER TRANSISTOR OR A SOURCE OF A PMOS CHARGE TRANSFER TRANSISTOR) OPTIONALLY ELECTRICALLY COUPLED TO AN INTERNAL NODE OF A CHARGE PUMP CELL IN A CASE OF AN NMOS OR AN OUTPUT NODE IN A CASE OF A PMOS, AND A VOLTAGE AT A SECOND TERMINAL OF THE FIRST TRANSISTOR (E.G., A SOURCE OF AN NMOS CHARGE TRANSFER TRANSISTOR OR DRAIN OF A PMOS CHARGE TRANSFER TRANSISTOR) OPTIONALLY ELECTRICALLY COUPLED TO AN INPUT NODE OF THE CHARGE PUMP CELL (E.G., A BOOST NODE) IN CASE OF NMOS, OR AN INTERNAL NODE OF THE CHARGE PUMP CELL IN CASE OF PMOS 706

APPLY THE SHIELD VOLTAGE TO THE BULK CONTACT OF THE FIRST TRANSISTOR (E.G., THE NMOS OR PMOS CHARGE TRANSFER TRANSISTOR) EXHIBITING A SECOND VOLTAGE LEVEL AT LEAST PARTIALLY RESPONSIVE TO A SECOND RELATIONSHIP BETWEEN THE VOLTAGE AT THE FIRST TERMINAL OF THE FIRST TRANSISTOR (E.G., A DRAIN OF AN NMOS CHARGE TRANSFER TRANSISTOR OR A SOURCE OF A PMOS CHARGE TRANSFER TRANSISTOR) OPTIONALLY ELECTRICALLY COUPLED TO THE INTERNAL NODE OF THE CHARGE PUMP CELL AND THE VOLTAGE AT THE SECOND TERMINAL OF THE FIRST TRANSISTOR (E.G., A SOURCE OF AN NMOS CHARGE TRANSFER TRANSISTOR OR DRAIN OF A PMOS CHARGE TRANSFER TRANSISTOR) OPTIONALLY ELECTRICALLY COUPLED TO THE INPUT NODE OF THE CHARGE PUMP CELL (E.G., A BOOST NODE) 708

FIG. 7B

```
┌─────────────────────────────────────────────────────────────────────────┐
│ OBSERVING THE FIRST RELATIONSHIP AT LEAST PARTIALLY RESPONSIVE TO A     │
│ VOLTAGE LEVEL EXHIBITED BY A VOLTAGE AT A FIRST TERMINAL OF AN NMOS     │
│ CHARGE TRANSFER TRANSISTOR (E.G., A DRAIN) BEING LOWER THAN A VOLTAGE   │
│ LEVEL EXHIBITED BY THE VOLTAGE AT THE SECOND TERMINAL OF THE NMOS       │
│ CHARGE TRANSFER TRANSISTOR (E.G., A SOURCE) 710                         │
└─────────────────────────────────────────────────────────────────────────┘
                                    │
                                    ▼
┌─────────────────────────────────────────────────────────────────────────┐
│ OBSERVING THE SECOND RELATIONSHIP AT LEAST PARTIALLY RESPONSIVE TO THE  │
│ VOLTAGE LEVEL EXHIBITED BY THE VOLTAGE AT THE SECOND TERMINAL OF THE    │
│ NMOS CHARGE TRANSFER TRANSISTOR (E.G., THE SOURCE) BEING LOWER THAN A   │
│ VOLTAGE LEVEL EXHIBITED BY THE VOLTAGE AT FIRST TERMINAL OF THE NMOS    │
│ CHARGE TRANSFER TRANSISTOR (E.G., THE DRAIN) 712                        │
└─────────────────────────────────────────────────────────────────────────┘
```

FIG. 7C

```
┌─────────────────────────────────────────────────────────────────────────┐
│ OBSERVING THE FIRST RELATIONSHIP AT LEAST PARTIALLY RESPONSIVE TO A     │
│ VOLTAGE LEVEL EXHIBITED BY A VOLTAGE AT A SECOND TERMINAL OF A PMOS     │
│ CHARGE TRANSFER TRANSISTOR (E.G., A SOURCE) BEING HIGHER THAN A VOLTAGE │
│ LEVEL EXHIBITED BY THE VOLTAGE AT A FIRST TERMINAL OF THE PMOS CHARGE   │
│ TRANSFER TRANSISTOR (E.G., A DRAIN) 714                                 │
└─────────────────────────────────────────────────────────────────────────┘
                                    │
                                    ▼
┌─────────────────────────────────────────────────────────────────────────┐
│ OBSERVING THE SECOND RELATIONSHIP AT LEAST PARTIALLY RESPONSIVE TO THE  │
│ VOLTAGE LEVEL EXHIBITED BY THE VOLTAGE AT THE FIRST TERMINAL OF THE     │
│ PMOS CHARGE TRANSFER TRANSISTOR (E.G., THE DRAIN) BEING HIGHER THAN A   │
│ VOLTAGE LEVEL EXHIBITED BY THE VOLTAGE AT SECOND TERMINAL OF THE CHARGE │
│ TRANSFER TRANSISTOR (E.G., THE SOURCE) 716                              │
└─────────────────────────────────────────────────────────────────────────┘
```

FIG. 7D

CHARGE PUMP CELL WITH IMPROVED LATCH-UP IMMUNITY AND CHARGE PUMPS INCLUDING THE SAME, AND RELATED SYSTEMS, METHODS AND DEVICES

CROSS-REFERENCE TO RELATED APPLICATION

This application is a divisional of U.S. patent application Ser. No. 17/318,596, filed May 12, 2021, now U.S. Pat. No. 11,552,559, issued Jan. 10, 2023, which claims the benefit under 35 U.S.C. § 119 (e) of U.S. Provisional Patent Application Ser. No. 63/026,435, filed May 18, 2020, the disclosure of each of which is hereby incorporated herein in its entirety by this reference.

FIELD

One or more examples relate, generally, to charge transfer switches. One or more examples relate, generally to charge pump cells for a charge pump and charge pumps including the same. CMOS devices that include such charge transfer switches, charge pump cells or charge pumps may exhibit latch-up immunity from parasitic structures that may conduct during power ON of such CMOS devices.

BACKGROUND

Complementary metal-oxide-semiconductor (CMOS) type charge pumps are used in a variety of operational contexts such as applications where a supply voltage is lower than the voltage utilized by an integrated circuit (IC) device to operate. A CMOS charge pump may function as a voltage multiplier, providing a voltage at its output exhibiting a voltage level that is a multiple of the voltage level exhibited by a voltage at its input (e.g., a supply voltage, without limitation), thereby providing sufficient voltage for an IC device to operate when a supply voltage would otherwise be too low.

By way of non-limiting example of a typical CMOS charge pump known to the inventors of this disclosure, the CMOS charge pump receives an input voltage and a pumping signal (e.g., a pulsed signal such as a clock or phase signal, without limitation), transfers the input voltage to a node (a "boost node") coupled to a side of a capacitor via a first charge transfer switch, boosts the input voltage at the boost node by applying the pumping signal to the other side of the capacitor, and transfers the boosted voltage to an output terminal via a second charge transfer switch. Due to current consumption at an external load coupled to the output terminal, a CMOS charge pump may need to constantly supply the boosted voltage. A typical CMOS charge pump can employ NMOS or PMOS transistors as transfer switches.

BRIEF DESCRIPTION OF THE DRAWINGS

FIG. 7B is a flow diagram depicting a process for applying a voltage to a bulk contact of a charge transfer transistor of a charge transfer switch, in accordance with one or more examples.

FIG. 7C and FIG. 7D are flow diagrams depicting processes for observing a first relationship and second relationship of a process depicted by FIG. 7B in a case of an NMOS or PMOS charge transfer transistor, respectively, in accordance with one or more examples.

DETAILED DESCRIPTION

Figure 1:
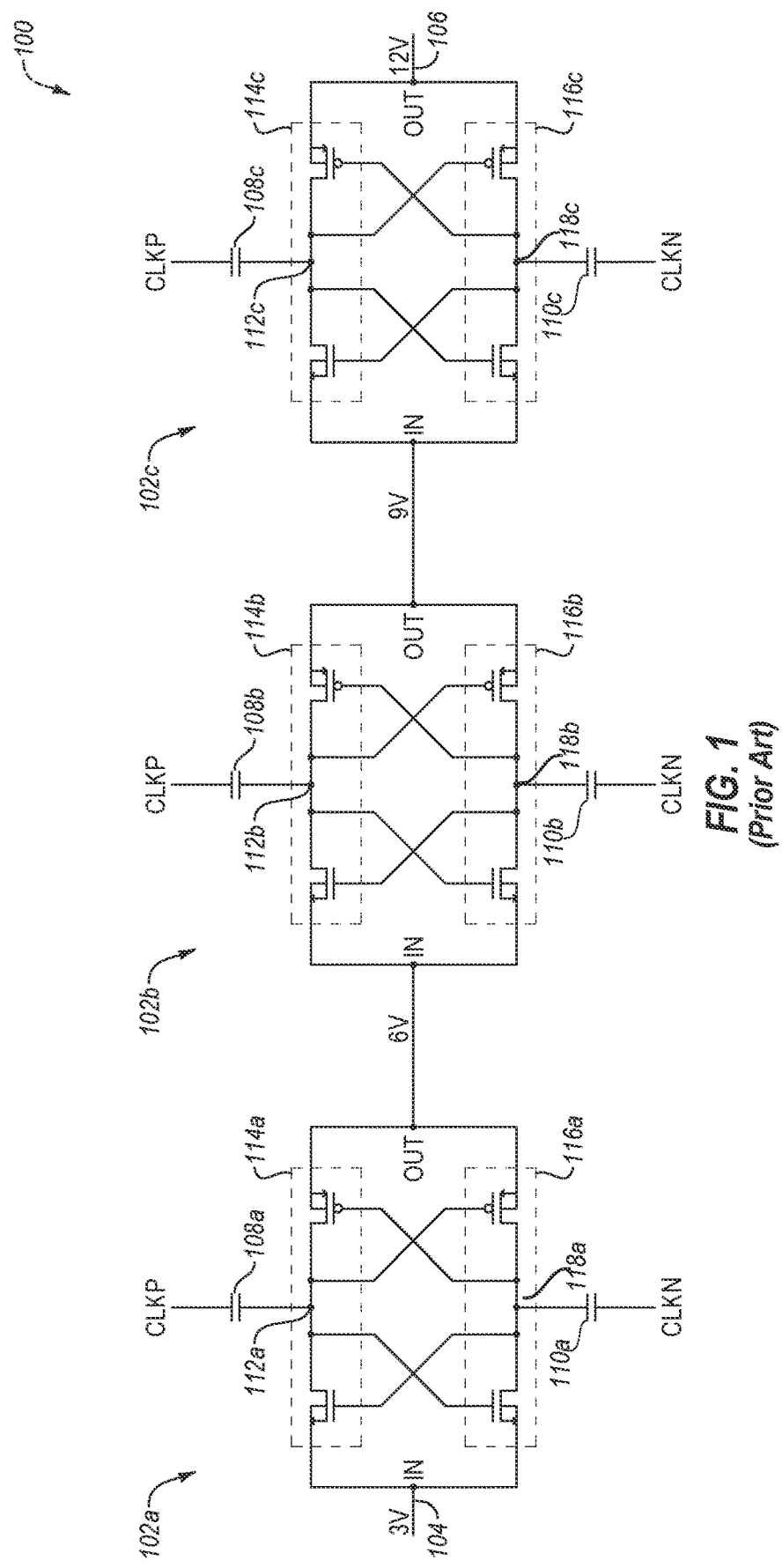
FIG. 1 a diagram depicting an existing charge pump known to the inventors of this disclosure that is susceptible to latch-up risk.

In the following detailed description, reference is made to the accompanying drawings, which form a part hereof, and in which are shown, by way of illustration, specific examples in which the present disclosure may be practiced. These examples are described in sufficient detail to enable a person of ordinary skill in the art to practice the present disclosure. However, other examples enabled herein may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example nor this disclosure to the specified components, steps, features, functions, or the like.

It will be readily understood that the components of the examples as generally described herein and illustrated in the drawings could be arranged and designed in a wide variety of different configurations. Thus, the following description of various examples is not intended to limit the scope of the present disclosure, but is merely representative of various examples. While the various aspects of the examples may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein.

Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein—all of which are encompassed by use of the term "processor." A general-purpose processor may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code, without limitation) related to examples of the present disclosure.

Examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" or "about" in reference to a given parameter, property, or condition means and includes to a degree that one of ordinary skill in the art would understand that the given parameter, property, or condition is met with a small degree of variance, such as within acceptable manufacturing or operating tolerances. By way of example, depending on the particular parameter, property, or condition that is substantially met, the parameter, property, or condition may be at least 90% met, at least 95% met, or even at least 99% met.

As used herein, any relational term, such as "over," "under," "on," "underlying," "upper," or "lower," without limitation, is used for clarity and convenience in understanding the disclosure and accompanying drawings and does not connote or depend on any specific preference, orientation, or order, except where the context clearly indicates otherwise.

In this description the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The term "connected" may be used in this description interchangeably with the term "coupled," and has the same meaning as "coupled" unless expressly indicated otherwise or the context would indicate otherwise to a person having ordinary skill in the art. It will be understood that when an element is referred to as "connecting" or "coupling" a first element and a second element then it is coupled to the first element and it is coupled to the second element.

When an element is referred to herein as being "electrically coupled" to another element, then one or more of charge or signals can be transferred between the element and the other element, directly or via intervening elements if any are present. It will be understood that when an element is referred to as "electrically connecting" or "electrically coupling" a first element and a second element, then one or more of charge or signals can be transferred between the first element and the second element via the element, directly or via intervening elements if any are present.

Operational requirements for application specific ICs (ASICs) and other ICs in certain applications often differ based on the specific application. As a non-limiting example, safety is a concern in automotive applications, so automotive intellectual property (IP) cell requirements (i.e., the requirements for integrated circuit designs for implementing electronic systems) are often different from other commercial requirements where safety is not a major concern.

As a non-limiting example, in a case of a touch ASIC (e.g., an ASIC utilized to control a touch display (e.g., on a smart phone, a tablet computer, a control unit of an appliance, or a control unit of an automobile or other vehicle, without limitation) or touch input (e.g., a touch pad or touch buttons, without limitation), without limitation), charge pumps may be utilized to provide a supply voltage exhibiting a voltage level better suited for scanning a screen (e.g., higher, without limitation) than an otherwise available supply voltage.

Charge pumps and other devices implemented in CMOS technology known to the inventors of this disclosure may be susceptible to a "latch-up" phenomenon, as a non-limiting example, during power-ON of a charge pump. Latch-up is a condition where a parasitic structure (e.g., a PNP Bipolar Junction Transistor (BJT) or a PN diode, without limitation) conducts at a CMOS structure, which may impair correct or reliable operation of a transistor or other CMOS device provided at the CMOS structure and devices including the same, and sometimes cause permanent damage thereto. If latch-up is experienced at a device then the device may fall short of the quality requirements for safety conscious applications such as automotive, medical, and certain industrial controls, without limitation.

FIG. 1 is a diagram depicting a charge pump 100 that is an example of the state of the art known to the inventors of this disclosure. Charge pump 100 includes three charge pump cells arranged in series between input node 104 and output node 106, charge pump cells 102a, 102b and 102c. Each of charge pump cells 102a-102c includes a P-side and an N-side designated by which one of a pair of 180 degrees out-of-phase pumping signals, CLKP or CLKN, is supplied to the side for application to respective ones of pumping capacitors 108a-108c and 110a-110c. Using charge pump cell 102a as an example, pumping signal CLKP is applied to pumping capacitor 108a, which pumping capacitor 108a is arranged to inject charge at internal node 112a in response to pumping signal CLKP. Charge transfer switches 114a-114c, internal nodes 112a-112c and pumping capacitors 108a-108c are referred to herein as being on the "P-side" of respective charge pump cells 102a-102c and charge pump 100 more generally. Similarly, charge transfer switches 116a-116c, internal nodes 118a-118c, and pumping capacitors 110a-110c are referred to herein as being on the "N-side" of respective charge pump cells 102a-102c and charge pump 100 more generally.

When pumping signals CLKP and CLKN are applied to charge pump cells 102a-102c and input voltage $V_{IN}$ is applied to input node 104 of charge pump 100 (in this specific example the input voltage $V_{IN}$ is set to 3V) an output voltage $V_{OUT}$ (in this specific example, 12V) is expected to be obtained at output node 106. As shown, about 6V is expected to be obtained at the output of charge pump cell 102a, supplied to the input of charge pump cell 102b, and a about 9V is expected to be obtained at the output of charge pump cell 102b, supplied to the input of charge pump cell 102c. Output voltage $V_{OUT}$ is a multiple of $V_{IN}$ where the relationship is at least partially based on the number of charge pump cells 102a-102c, capacitances of pumping capacitors 108a-108c and 110a-110c, and frequencies of the pumping signals CLKN and CLKP.

Each one of charge pump cell 102a-102c is a CMOS device including cross-coupled PMOS (P-type Metal-Oxide-Semiconductor) transistors and cross-coupled NMOS (N-type Metal-Oxide-Semiconductor) transistors, in both cases enhancement type. The bulk and source of respective CMOS transistors of charge pump cells 102a-102c are electrically coupled.

Figure 2:
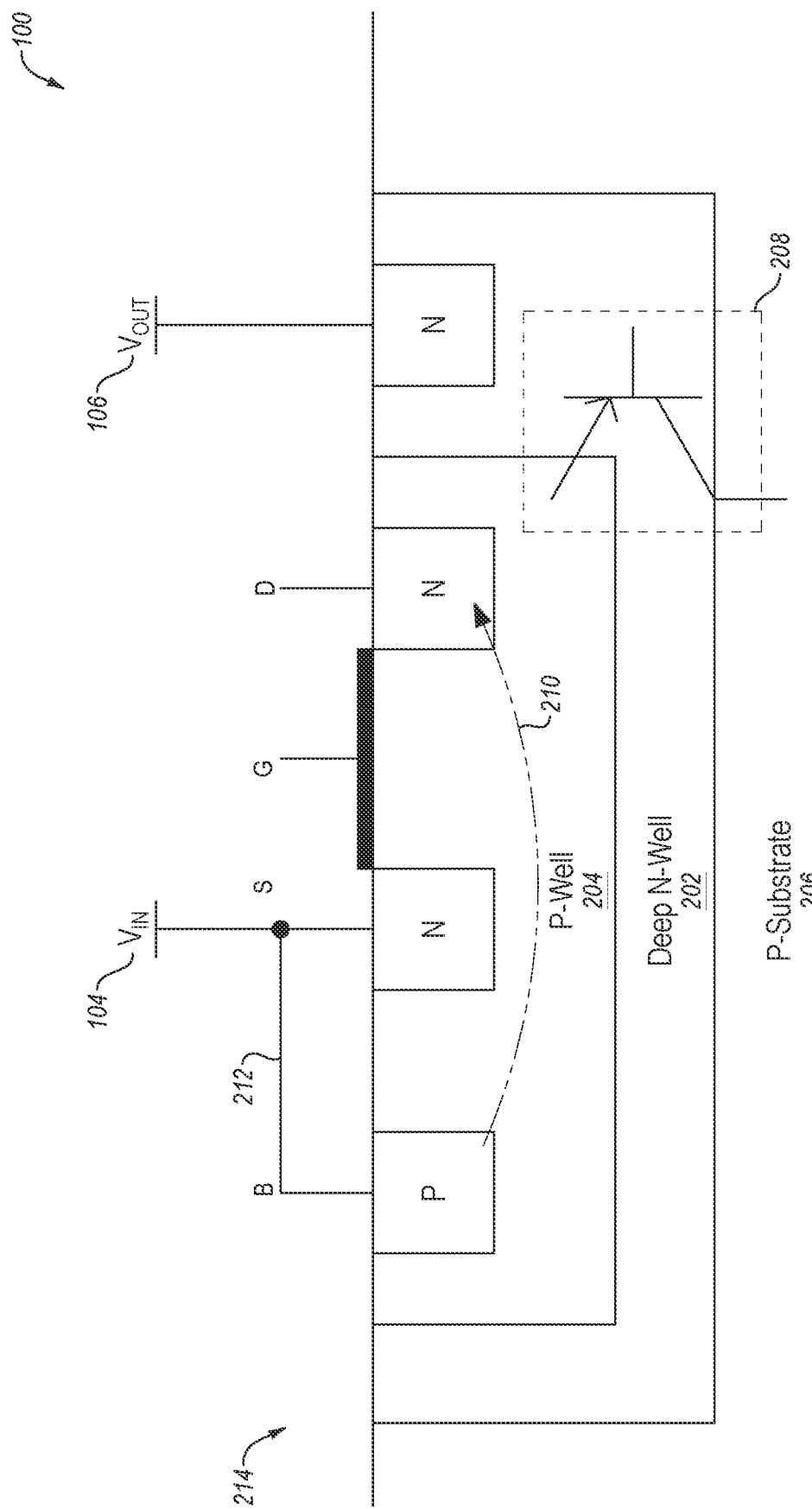
FIG. 2 is a diagram depicting an NMOS transistor (in this specific example an NMOS transistor with three terminals for source, drain and gate) of any one of charge pump cells depicted by FIG. 1.

FIG. 2 is a diagram depicting an example NMOS charge transfer switch 200 of any one of charge pump cells 102a-102c of FIG. 1 having parasitic structures, in accordance with the state of the art known to the inventors of this disclosure. NMOS charge transfer switch 200 is an NMOS transistor built in a deep N-well 202 and a P-well 204 of a CMOS structure 214, which are electrically coupled via electrical coupling 212 of a bulk contact B and source terminal S of the NMOS transistor. Notably, an NMOS transistor built in a deep N-well may limit, for design purposes, the bulk and drain voltage to be within a pre-specified range of voltages during operation, for example, to attempt to avoid latch-up.

Regarding latch-up, during power ON of NMOS charge transfer switch 200, deep N-well 202 is electrically coupled to a highest voltage level (i.e., a reliably highest available voltage level) in a charge pump or charge pump cell (e.g., charge pump 100 or charge pump cell 102a-102c, without limitation) to inhibit the conduction of a parasitic PNP bipolar junction transistor (BJT) 208 where P-well 204 is the Emitter, deep N-well 202 is the Base, and P-substrate 206 is the Collector. Parasitic PNP BJT 208 conducts when its Emitter voltage (e.g., voltage level at P-well 204) is higher than its Base voltage (e.g., voltage level at deep N-well 202) and its Base voltage is higher than its Collector voltage (e.g., voltage level at P-substrate 206). Forcing a voltage at deep N-well 202 to a highest voltage level exhibited at a charge pump or a charge pump cell ensures that the Base voltage is greater than or equal to the Emitter voltage of the parasitic PNP BJT 208. In charge pump 100, one might reasonably expect the highest voltage level (i.e., reliably highest available voltage level) to be exhibited by the output voltage $V_{OUT}$ of the charge pump 100, and so in charge pump 100, the respective deep N-wells of charge transfer switches 116a-116c are electrically coupled to output node 106 to receive output voltage $V_{OUT}$, such as depicted by FIG. 2 where deep N-well 202 is electrically coupled to output node 106 to receive output voltage $V_{OUT}$.

It is now appreciated by the inventors of this disclosure that upon powering ON of a charge pump 100 and charge pump cells 102a, 102b and 102c, the output voltage $V_{OUT}$ at output node 106 initially is 0V and then ramps up, over a short time duration (referred to herein as a "ramp-up period") to a voltage level that is the highest voltage level at charge pump 100 and then eventually a fully boosted voltage level. During an initial time duration of a ramp-up period, the output voltage $V_{OUT}$ is not the highest voltage level at charge pump 100, so a parasitic PNP BJT 208 may conduct when its Emitter voltage (e.g., voltage level at P-well 204) is higher than its Base voltage (e.g., voltage level at deep N-well 202) and its Base voltage is higher than its Collector voltage (e.g., voltage level at P-substrate 206). In the example CMOS structure depicted by FIG. 2, a conducting parasitic PNP BJT 208 may inject current to the P-substrate 206 (stated another way, a leakage current may flow from P-well 204 to P-substrate 206). In a CMOS device on silicon such as NMOS charge transfer switch 200, a flow of leakage current into P-substrate 206 may cause a latch-up phenomenon, which may decrease reliability of such a CMOS device or product (e.g., a charge pump may generate less than the fully boosted voltage or even 0 volts, and there may be heavy power loss from current running to ground, without limitation) and increase the risk that such a CMOS device or product will fail, in some cases, irreversibly. Accordingly, conduction by a parasitic PNP BJT 208 increases the risk of latch-up of a charge pump cell (e.g., charge pump cells 102a-102c, without limitation) and a charge pump (e.g., charge pump 100, without limitation) including the same.

In a typical charge pump, P-well 204 of NMOS charge transfer switch 200 is electrically coupled to the input voltage $V_{IN}$, and the input voltage $V_{IN}$ at input node 104 is generally the lowest voltage level exhibited at such a charge pump during its operation. It is now appreciated by the inventors of this disclosure that during powering ON of NMOS charge transfer switch 200 the input voltage $V_{IN}$ will at least temporarily (i.e., at least some portion of the ramp-up period) be greater than the output voltage $V_{OUT}$, and a parasitic PN diode 210 may (additionally or alternatively to parasitic PNP BJT 208) conduct, where P-well 204 is the Anode and the Drain (D)-N junction is the Cathode. Such a parasitic PN diode 210 may inject current to the P-well 204 when the voltage of the Anode is greater than the voltage level of the Cathode of the parasitic PN diode 210. The flow of a leakage current into P-well 204 of a CMOS device increases the risk of a latch-up phenomenon and the problems associated therewith discussed above. While not depicted, a parasitic diode or BJT may similarly conduct from the Drain-P junction, N-well, and P-substrate of a PMOS transistor.

One option for improving latch-up immunity known to the inventors of this disclosure is to pre-charge one or more nodes of a charge pump (e.g., input node, output node, boost node, or an internal node not associated with charge pumping, without limitation) to a suitably high voltage before a charge pump starts operating (e.g., before power-ON or after power-ON but before applying input voltage $V_{IN}$, without limitation). For example, this may be accomplished by utilizing an auxiliary charge pump to pre-charge one or more input, output, or internal nodes of a charge pump or charge pump cell. The inventors of this disclosure now appreciate that performing a pre-charge adds a time duration (i.e., a "pre-charge phase") to startup of a charge pump or charge pump cell as well as a silicon real-estate cost.

The inventors of this disclosure now appreciate the desirability of a charge transfer switch or charge pump cell with improved latch-up immunity and improved performance from reduced latch-up risk (i.e., has latch-up immunity), that maintains low area cost (e.g., of silicon as compared to, as a non-limiting example, charge pumps that utilize an auxiliary charge pump described above), and, additionally or alternatively, exhibits a short time duration to power ON (e.g., as compared to, as a non-limiting example, charge pumps that utilize an auxiliary charge pump described above which add a pre-charge phase).

One or more examples relate, generally, to a charge transfer switch that exhibits latch-up immunity. A charge pump cell including such a charge transfer switch may exhibit increased latch-up immunity and so may charge pumps including the same. In one or more examples, such a charge pump cell may include a charge transfer switch that includes: a transistor provided at a CMOS structure, such a transistor for electrical coupling of an input node to a boost node (and also referred to herein as a "charge transfer transistor"); a first shield circuit arranged to provide a shield voltage $V_{SH}$ to a bulk (e.g., P-well or P-substrate, without limitation) of the CMOS structure; and a second shield circuit arranged to provide shield voltage $V_{SH}$ to a deep-N well of the CMOS structure. In one or more examples, the shield voltage $V_{SH}$ may exhibit a voltage level that is a lowest available voltage level exhibited at the charge pump cell or charge pump more generally. The first shield circuit may include a voltage selector configured to select a lowest voltage level exhibited between a voltage at a source of the transistor (which may be electrically coupled to an input node of a charge pump cell) and a voltage at a drain of the transistor (which may be electrically coupled to an internal node of a charge pump cell at which a boosted voltage is generated in response to a pumping signal (which internal node may also referred to herein as a "boost node")).

Notably, no specific degree of latch-up immunity at a charge pump cell or charge pump is required by this disclosure unless expressly stated. As a non-limiting example, disclosed charge pump cells may be utilized in a totality or fewer than a totality of charge pump cells of a charge pump, and disclosed charge transfer switches may be utilized in a totality or fewer than a totality of charge transfer switches of a charge pump cell—in all cases without exceeding the scope of this disclosure.

Figure 3:
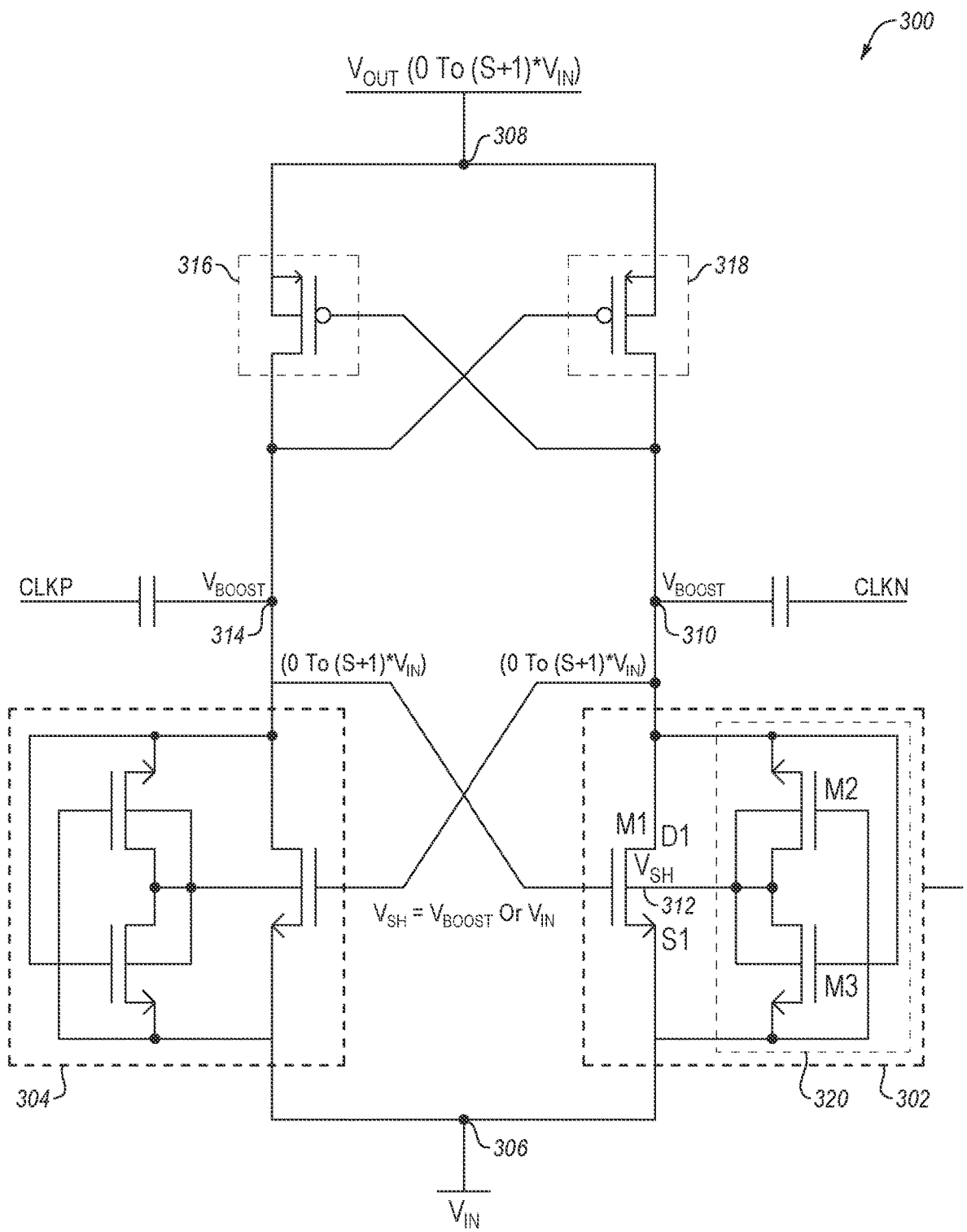
FIG. 3 is a diagram depicting a charge pump cell that may exhibit improved latch-up immunity in accordance with one or more examples.

FIG. 3 is a diagram depicting a charge pump cell 300 that may exhibit improved latch-up immunity in accordance with one or more examples. Generally, charge pump cell 300 is configured to generate an output voltage $V_{OUT}$ at output node 308 in response to pumping signals CLKP and CLKN and input voltage $V_{IN}$. Charge pump cell 300 includes cross-coupled NMOS charge transfer switches 302 and 304, also referred to herein as "first NMOS charge transfer switch 302" and "second NMOS charge transfer switch 304" and cross-coupled PMOS charge transfer switches 316 and 318.

NMOS charge transfer switches 302 and 304 of charge pump cell 300 respectively include three NMOS transistors arranged (i.e., via electrical couplings of their respective terminals and bulk contacts as depicted by FIG. 3) as a single NMOS transfer switch (i.e., first charge transfer switch 302 and second charge transfer switch 304). Charge transfer switches 302 and 304 respectively include an NMOS charge transfer transistor M1 (referred to herein as a "charge transfer transistor M1" and more generally as a "first transistor") that is assisted by a circuit 320 configured, generally, to apply the shield voltage exhibiting a lower of a voltage level exhibited by the voltage at the first terminal and a voltage level exhibited by the voltage at the second terminal. Circuit 320 may include an arrangement of two NMOS transistors M2 and M3 (referred to herein as "transistor M2" and "transistor M3," and more generally as a "second transistor" and a "third transistor"). The gates of respective charge transfer transistors of charge transfer switches 302 and 304 are electrically coupled to internal nodes 310 and 314, respectively. For ease of illustration, only transistors M1, M2 and M3 for first charge transfer switch 302 are depicted by FIG. 3, though the discussion of first charge transfer switch 302 also applies to second charge transfer switch 304.

In one or more examples, during a power ON of charge pump cell 300 and more specifically charge transfer switch 302, a shield voltage $V_{SH}$ is applied to a bulk contact 312 of charge transfer transistor M1 (e.g., an electrically conductive material directly coupled to a P-well of a CMOS structure at which charge transfer transistor M1 is provided) to inhibit generation of a leakage current into P-well 404, as will be described further below in relation to FIG. 4, e.g., as discussed above during power-ON, without limitation.

In one or more examples, transistors M2 and M3 are arranged as circuit 320 configured to select a voltage exhibiting a lowest voltage level (as discussed below) and apply the selected voltage as shield voltage $V_{SH}$ to bulk contact 312 of charge transfer transistor M1 to force the P-well 404 of charge transfer transistor M1 to a lowest voltage level in charge pump cell 300 and so ensure that a voltage level at the P-well 404 is not higher than a voltage level at a deep N-well 402, as will be described further below in relation to FIG. 4. Such a voltage selector selects between a voltage at a source S1 of charge transfer transistor M1 (also referred to herein as a "second terminal" of charge transfer transistor M1 and charge transfer switch 302 more generally) that is electrically coupled to an input node 306 of charge pump cell 300 to receive input voltage $V_{IN}$, and a voltage at transistor charge transfer M1 drain D1 (also referred to herein as a "first terminal" of charge transfer transistor M1 and charge transfer switch 302 more generally) that is electrically coupled to internal node 310 to receive a boost voltage VBOOST exhibiting a voltage level ranging from about 0 to about $(S+1)*V_{IN}$, wherein S is a number of stages of charge pump cells to a given node.

Figure 4:
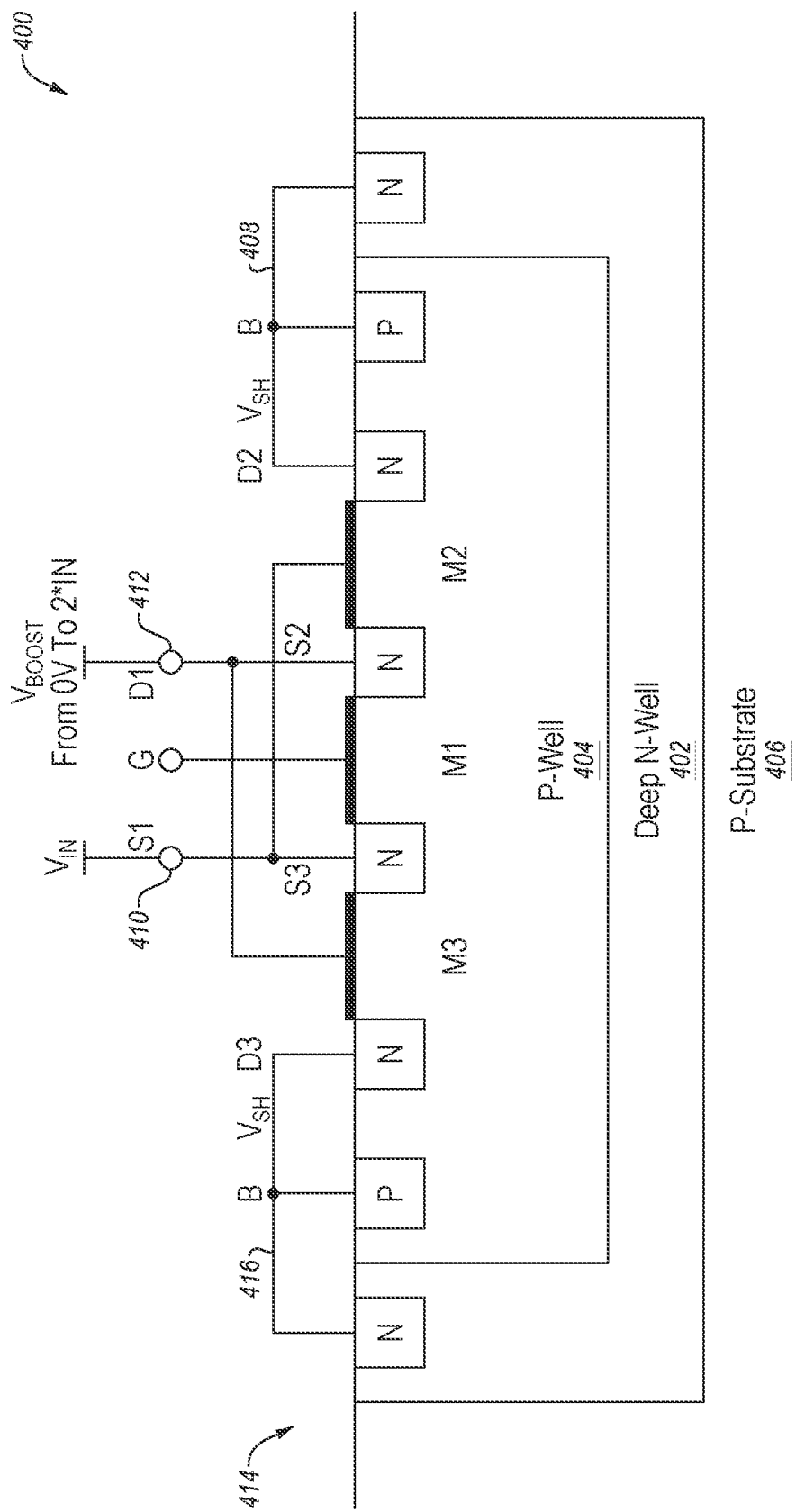
FIG. 4 is a schematic diagram depicting a charge transfer switch in accordance with one or more examples.

Generally, during power ON of charge pump cell 300 and charge transfer switch 302 more specifically, the shield voltage $V_{SH}$ is further applied to deep N-well 402 of charge transfer transistor M1 (as depicted by FIG. 4). Accordingly, the voltage levels exhibited at the P-well 404 and the deep N-well 402 of a CMOS structure at which charge transfer transistor M1 is provided are substantially the same. Exhibiting equal voltage levels at Emitter and Base of the parasitic PNP BJT inhibits conduction by the PNP BJT, and so no current is injected to P-substrate 406. Further, exhibiting equal voltage levels at the Anode and Cathode of a parasitic diode inhibits conduction by the parasitic diode and so no current is injected into the P-well.

FIG. 4 is a schematic diagram depicting a charge transfer switch 400 in accordance with one or more examples. Charge transfer switch 400 is a non-limiting example of charge transfer switches 302 or 304 of FIG. 3.

The CMOS structure 414 includes a single P-well (P-well 404) and a single deep N-well (deep N-well 402) that substantially encapsulates the single P-well 404. Transistors M1, M2 and M3 are provided in the CMOS structure 414 and, more specifically, in the single P-well 404 and the single deep N-well 402 that substantially encapsulates the single P-well 404 and is supported by a common P-substrate 406. Deep N-well 402 is thus arranged between the P-well 404 and the P-substrate 406.

A gate of transistor M2 is electrically coupled to a source S1 of charge transfer transistor M1 and a gate of transistor M3 is electrically coupled to a drain D1 of charge transfer transistor M1, a drain D2 of transistor M2 is electrically coupled to bulk contact 408 of charge transfer transistor M1, and a drain D3 of transistor M3 is electrically coupled to bulk contact 416 of charge transfer transistor M1. Bulk contact 416 is electrically coupled to P-well 404 and to deep N-well 402. When the voltage level exhibited at source S1 is greater than a voltage level exhibited at drain D1 (e.g., a voltage differential between S1 and D1 increases to above a threshold), transistor M2 turns ON (transistor M3 is OFF) and forces the voltage at bulk contact 408 to a voltage level exhibited at source S2 of transistor M2 which also is drain D1 of charge transfer transistor M1 (collectively first terminal 412 of charge transfer switch 400). When the voltage level exhibited at drain D1 is greater than a voltage level exhibited at source S1 (e.g., a voltage differential between S1 and D1 decreases to below a threshold), transistor M2 turns OFF and transistor M3 turns ON, and transistor M3 forces the voltage at bulk contact 408 to a voltage level exhibited at source S3 of transistor M2 which also is source S1 of charge transfer transistor M1 and collectively second terminal 410 of charge transfer switch 400.

In the specific non-limiting example depicted by FIG. 3, the PMOS charge transfer switches 316 and 318 of charge pump cell 300 do not include circuits for increasing latch-up immunity. As discussed with respect to FIG. 5 and FIG. 6, in one or more examples a charge pump cell may include a PMOS charge transfer switch configured to increase latch-up immunity.

Figure 5:
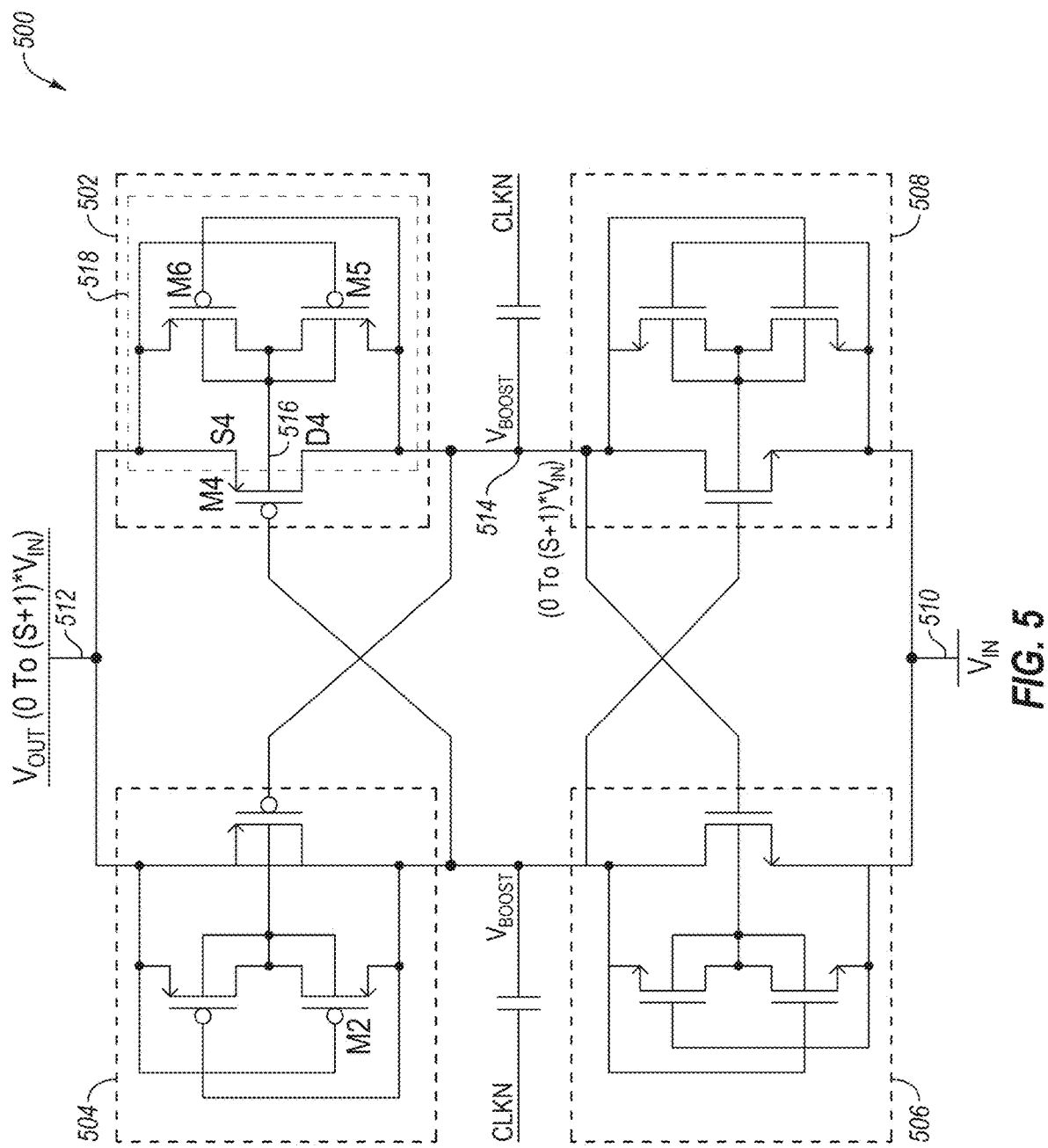
FIG. 5 is a diagram depicting a charge pump cell that may exhibit improved latch-up immunity in accordance with one or more examples.

FIG. 5 is a diagram depicting a charge pump cell 500 that may exhibit improved latch-up immunity in accordance with one or more examples. Charge pump cell 500 includes cross-coupled charge transfer switches 506 and 508 of an NMOS variety (such as charge transfer switches 302 and 304 of FIG. 3, without limitation) electrically coupled to input node 510 of charge pump cell 500, and includes cross coupled charge transfer switches 502 and 504 of a PMOS variety electrically coupled to output node 512 of charge pump cell 500. Charge transfer switches 502 and 504 may be referred to herein as "first charge transfer switch 502" and "second charge transfer switch 504," respectively.

Pumping signals CLKP and CLKN may be provide by a digital circuit configured to provide two oscillating signals that are in the same frequency but 180° phase shifted with respect to each other. An operating frequency (or range of frequencies) of disclosed charge transfer switches, charge pump cells and charge pumps may be at least partially based on a capacitance of a pump capacitor to which a pumping signal is applied (e.g., at charge pump cell 300 or charge pump cell 500, without limitation). Generally, the magnitude of a frequency for a pumping signal to sufficiently charge a pump capacitor has an inverse relationship to the magnitude of the capacitance of the pump capacitor. As a non-limiting example, for a small capacitance (e.g., a capacitor that fits on-chip, typically about 1 pF to about 100 pF for a charge pump, without limitation) pump capacitor the charge transfer switches 502, 504, 506 and 508 (as well as charge transfer switches 302 and 304) may operate at least up to 40 MHz, and charge pump cell 500 (as well as charge pump cell 300) supports frequencies of pumping signals CLKP and CLKN at least up to 40 MHz. Further, the higher the frequency of a pumping signal, the lower the voltage ripple exhibited by the output voltage $V_{OUT}$, which may be desirable in some applications. So, in one or more examples, an operating frequency (or range of frequencies) of disclosed charge transfer switches, charge pump cells, and charge pumps may be at least partially based on (additionally or alternatively to the capacitance of pump capacitors) a desired magnitude (or range of magnitudes) of voltage ripple exhibited by the output voltage $V_{OUT}$. For a large capacitance (e.g., a capacitor that does not reasonably fit on-chip, typically greater than about 100 pF) pump capacitor, the pump capacitor is typically off-chip. Use of a large capacitance pump capacitor reduces the frequency at which the charge transfer switches may operate and frequency of supported pumping signals, as compared to small capacitance pump capacitors.

Charge transfer switches 502 and 504 respectively include three PMOS transistors arranged (i.e., via electrical coupling of their respective terminals as depicted by FIG. 5) as a single PMOS charge transfer switch. Both charge transfer switches 502 and 504 include a PMOS charge transfer transistor M4 (referred to herein as "charge transfer transistor M4" and more generally as a "first transistor") that is assisted by a circuit 518 that includes an arrangement of the two PMOS transistors M5 and M6 (referred to herein as "transistor M5" and "transistor M6," and more generally as a "second transistor" and a "third transistor"). For simplicity of description, transistors M4, M5 and M6 are only depicted with respect to charge transfer switch 502.

Figure 6:
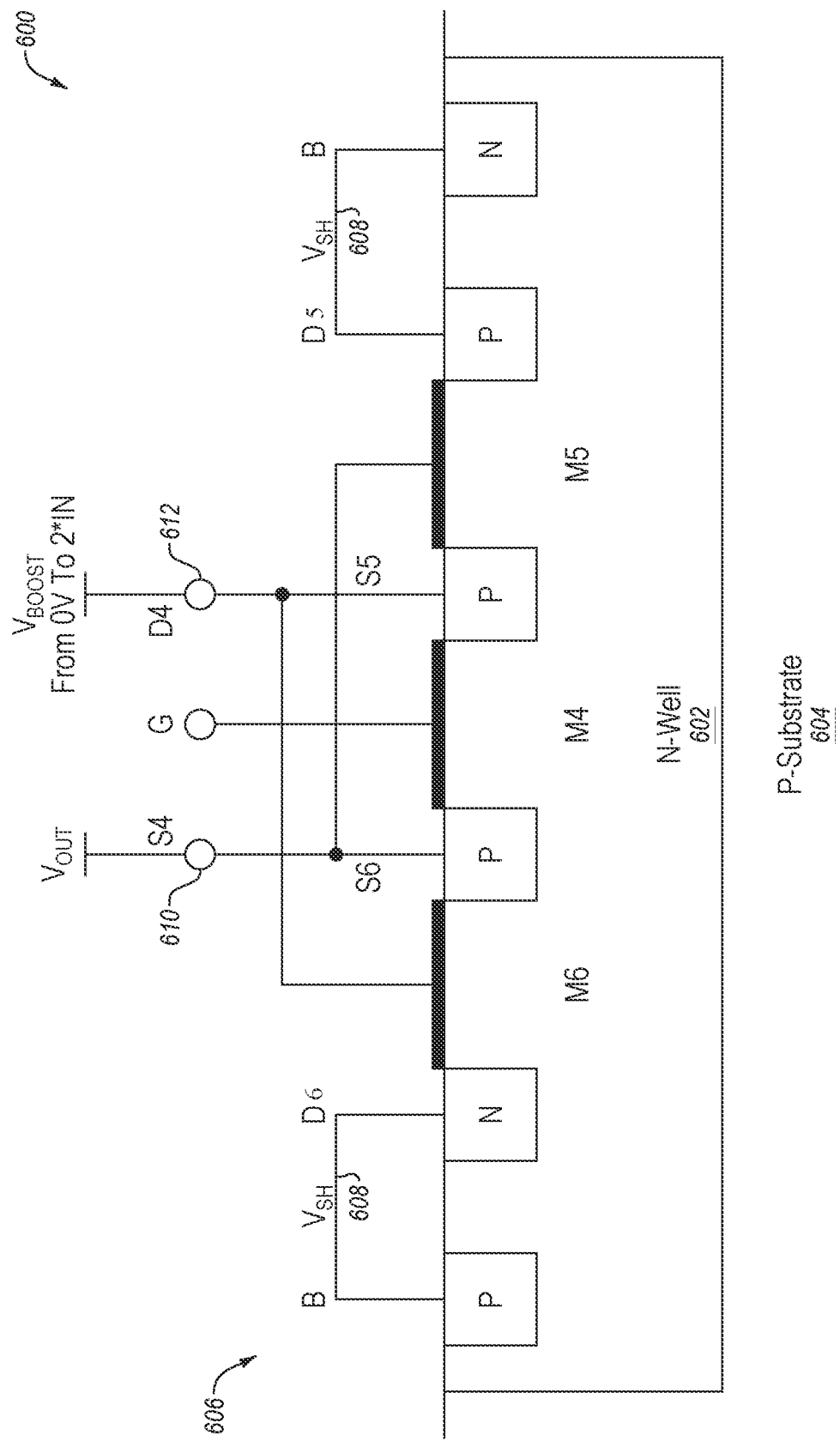
FIG. 6 a schematic diagram depicting a charge transfer switch in accordance with one or more examples, and which is a non-limiting example of a charge transfer switch depicted by FIG. 5.

Generally, during operation of charge transfer switch 502, a shield voltage $V_{SH}$ is applied to a bulk contact 516 of charge transfer transistor M4 (e.g., a conductive structure including an electrically conductive material, electrically coupled to N-well 602 of a CMOS structure 606 at which charge transfer transistor M4 is provided, as depicted by FIG. 6) to inhibit generation of a leakage current (e.g., as discussed above by a conducting PN diode, or BJT, during power-ON, to N-well 602 or P-substrate 604, without limitation).

FIG. 6 is a schematic diagram depicting a charge transfer switch 600 in accordance with one or more examples, and which is a non-limiting example of a charge transfer switch 502 or 504 of FIG. 5.

More specifically, and turning back to FIG. 5, circuit 518 is configured, generally, to apply the shield voltage exhibiting a higher of a voltage level exhibited by the voltage at a second terminal (e.g., a drain D4 of charge transfer transistor M4 electrically coupled to an internal node 514 of charge pump cell 500 exhibiting a voltage level ranging from about 0V to about $(S+1)*V_{IN}$) and a voltage level exhibited by the voltage at a first terminal (e.g., a source S4 of charge transfer transistor M4 electrically coupled to output node 512 which ramps from about 0V to about $(S+1)*V_{IN}$) to force a bulk contact 608 and N-well 602 of CMOS structure 606 to exhibit the highest voltage level at a charge pump cell (e.g., charge pump cell 500).

The transistor M5 is arranged at circuit 518 to turn ON at least partially responsive to a voltage at the drain D4 of PMOS charge transfer transistor M4 (a "second terminal 612" which also is a source S5 of transistor M5) exhibiting a higher voltage level than a voltage level exhibited by a voltage at the source S4 of PMOS charge transfer transistor M4 (a "first terminal 610" that is electrically coupled to a gate of transistor M5), and to turn OFF at least partially responsive to the voltage at the drain D4 of PMOS charge transfer transistor M4 exhibiting a lower voltage level than the voltage level exhibited by the voltage at the source S4 of PMOS charge transfer transistor M4. Transistor M6 is arranged at circuit 518 to turn ON at least partially responsive to a voltage at the source S4 of PMOS charge transfer transistor M4 (the "first terminal 610" which also is a source S6 of transistor M6) exhibiting a higher voltage level than a voltage level exhibited by a voltage at the drain D4 of PMOS charge transfer transistor M4 (the "second terminal 612" that is electrically coupled to a gate of transistor M6), and to turn OFF at least partially responsive to the voltage at the source S4 of PMOS charge transfer transistor M4 exhibiting a lower voltage level than the voltage level exhibited by the drain D4 of PMOS charge transfer transistor M4.

The arrangement of charge transfer switch 600, and circuit 518 more specifically, continuously applies a voltage exhibiting a highest voltage level between the voltages at source S4 and drain D4 to bulk contact 608 and N-well 602 of CMOS structure 606 where all three PMOS transistors M4, M5 and M6 are provided. There is no opportunity (i.e., inconsequentially if ever) for a PN diode (where N-well 602 is the Cathode and either the P-S4 junction or P-D4 junction is the Anode as discussed above) to conduct. Accordingly, no leakage current (i.e., an inconsequential amount if any) is generated that flows to N-well 602, and so latch-up risk in the PMOS charge transfer transistors of charge transfer switches 502 and 504 of charge pump cell 500 is reduced.

Figure 7A:
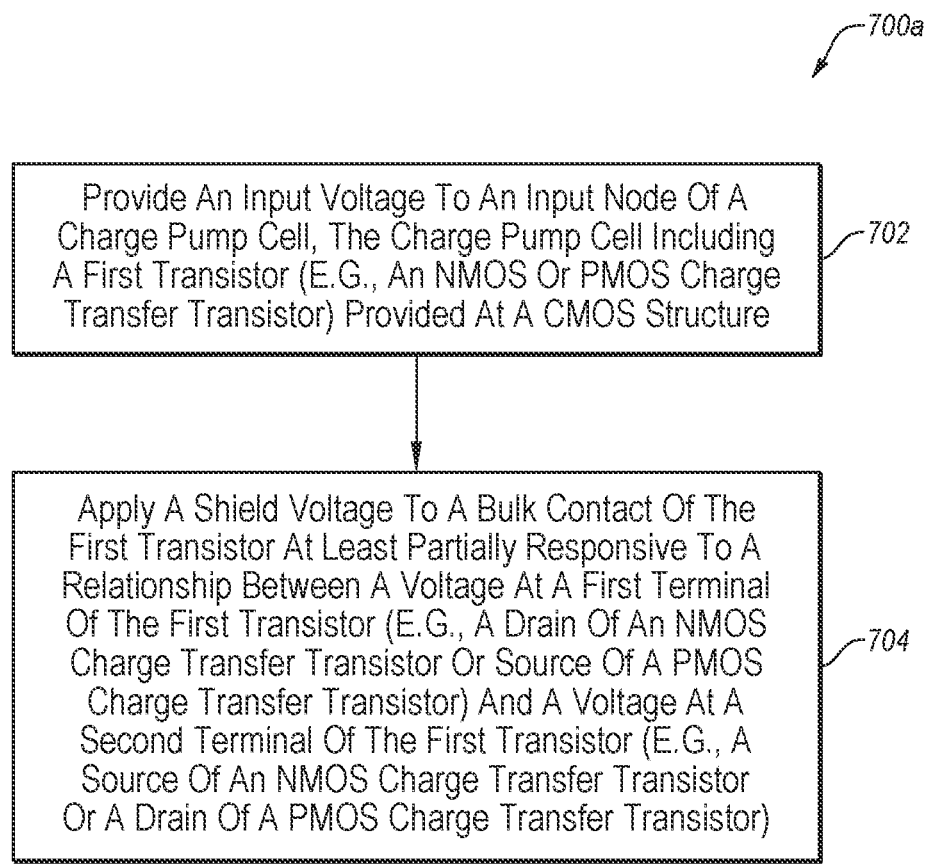
FIG. 7A is a flow diagram depicting a process for operating a charge transfer transistor of a charge transfer switch, in accordance with one or more examples.

FIG. 7A is a flow diagram depicting a process 700a for operating a first transistor (e.g., an NMOS or PMOS charge transfer transistor, without limitation) of a charge transfer switch during power ON of a charge pump cell or charge pump more generally, in accordance with one or more examples. Operations of FIG. 7A may be performed, as a non-limiting example, by circuit 320 of FIG. 3 or 508 of FIG. 5.

At operation 702, process 700a provides an input voltage to an input node of a charge pump cell. The charge pump cell may include a first transistor (e.g., a NMOS or PMOS charge transfer transistor, without limitation) provided at a CMOS structure.

At operation 704, process 700a applies a shield voltage to a bulk contact of the first transistor responsive to a relationship between a voltage at a first terminal of the first transistor (e.g., a drain of an NMOS charge transfer transistor or source of a PMOS charge transfer transistor, without limitation) and a voltage at a second terminal of the first transistor (e.g., at a source of the NMOS charge transfer transistor or drain of a PMOS charge transfer transistor, without limitation). In a case where the first transistor is an NMOS charge transfer transistor the bulk contact is electrically coupled to a P-well of the NMOS transistor. In a case where the first transistor is a PMOS charge transfer transistor the bulk contact is electrically coupled to a N-well of the PMOS transistor.

FIG. 7B is a flow diagram depicting a process 700b for applying a voltage to a bulk contact of a transistor of a charge transfer switch of a charge pump cell, in accordance with one or more examples. Operations of FIG. 7A may be performed, as a non-limiting example, by circuit 320 of FIG. 3 or 508 of FIG. 5.

At operation 706, process 700b applies a shield voltage to a bulk contact of a first transistor (e.g., an NMOS or PMOS charge transfer transistor, without limitation) exhibiting a first voltage level responsive to a first relationship between a voltage at a first terminal of the first transistor (e.g., a drain of an NMOS charge transfer transistor or source of a PMOS charge transfer transistor, without limitation) and a voltage at a second terminal of the first transistor (e.g., a source of an NMOS charge transfer transistor or drain of a PMOS charge transfer transistor, without limitation).

At operation 708, process 700b applies the shield voltage to the bulk contact of the first transistor (e.g., the NMOS or PMOS charge transfer transistor, without limitation) exhibiting a second voltage level responsive to a second relationship between the voltage at the first terminal of the first transistor (e.g., a drain of an NMOS charge transfer transistor or a source of a PMOS charge transfer transistor, without limitation) and the voltage at the second terminal of the charge transfer transistor (e.g., a source of an NMOS charge transfer transistor or drain of a PMOS charge transfer transistor, without limitation). In one or more examples, the second relationship is different from the first relationship, and may be opposing the first relationship.

In one or more examples, the first terminal may optionally be electrically coupled to an internal or output node of a charge pump cell (e.g., a boost node, without limitation) or to an output node of a charge pump, and the second terminal may optionally be electrically coupled to an input node of a charge pump cell or charge pump, in an example of an NMOS charge transfer transistor. In one or more examples, the first terminal may optionally be electrically coupled to an output node of a charge pump cell or charge pump, and the second terminal may optionally be electrically coupled to an internal node of a charge pump cell (e.g., a boost node, without limitation), in an example of a PMOS charge transfer transistor.

FIG. 7C and FIG. 7D are flow diagrams depicting processes 700c and 700d for observing a first relationship and second relationship of process 700b in a case of an NMOS or PMOS charge transfer transistor, respectively, in accordance with one or more examples. Operations of FIG. 7C may be performed, as a non-limiting example, by circuit 320 of FIG. 3, and operations of FIG. 7D may be performed, as a non-limiting example, by circuit 508 of FIG. 5.

In one or more examples where the first transistor of process 700b is an NMOS charge transfer transistor (e.g., charge transfer transistor M1 of FIG. 3 or FIG. 4, without limitation), process 700c is a process for applying the shield voltage exhibiting a lower of a voltage level exhibited by the voltage at the first terminal and a voltage level exhibited by the voltage at the second terminal, in accordance with one or more examples.

At operation 710, process 700c observes the first relationship responsive to a voltage level exhibited by a voltage at a first terminal (optionally electrically coupled to an internal node of a charge pump cell (e.g., a boost node, without limitation)) of the NMOS charge transfer transistor being lower than a voltage level exhibited by a voltage at a second terminal of the NMOS charge transfer transistor (optionally electrically coupled to an input node of the charge pump cell). During at least an initial time duration of power ON of the charge pump cell (i.e., a ramp up period discussed above), the lower of the voltages is the voltage at the internal node, and the higher voltage is at the input node, and process 700c applies the voltage level at the internal node to the bulk contact of the NMOS charge transfer transistor.

At operation 712, process 700c observes the second relationship responsive to a voltage level exhibited by a voltage at the second terminal of the NMOS charge transfer transistor (optionally electrically coupled to an input node of the charge pump) being lower than a voltage level exhibited by a voltage at the first terminal of the NMOS charge transfer transistor (optionally electrically coupled to an internal node of the charge pump cell (e.g., a boost node, without limitation)). After the ramp-up period, the voltage level at such an internal node increases (i.e., ramps up) in response to the application of the pumping signal, and when the voltage level at the input node is lower than the voltage level at the internal node, process 700c applies the voltage level at the input node to the bulk contact of the NMOS charge transfer transistor.

In one or more examples where the first transistor of process 700b is a PMOS charge transfer transistor (e.g., charge transfer transistor M4 of FIG. 5 or FIG. 6, without limitation), process 700d is a process for applying the shield voltage exhibiting a higher of a voltage level exhibited by the voltage at the first terminal and a voltage level exhibited by the voltage at the second terminal, in accordance with one or more examples.

At operation 714, process 700d observes the first relationship responsive to a voltage level exhibited by a voltage at the second terminal of the PMOS charge transfer transistor (optionally electrically coupled to an internal node of the charge pump cell (e.g., a boost node, without limitation)) being higher than a voltage level exhibited by the voltage at the first terminal of the PMOS charge transfer transistor (optionally electrically coupled to an output node of the charge pump cell). During at least an initial time duration of power ON of a charge pump cell (i.e., a ramp up period discussed above), the higher of the voltages is the voltage at the internal node of the charge pump cell and process 700b applies the voltage level at the internal node to the bulk contact of the PMOS charge transfer transistor.

At operation 716, process 700d observes the second relationship responsive to the voltage level exhibited by the voltage at the first terminal of the PMOS charge transfer transistor (optionally electrically coupled to an output node of the charge pump cell) is higher than the voltage level exhibited by the voltage at the second terminal of the PMOS charge transfer transistor (optionally electrically coupled to an internal node of the charge pump cell (e.g., a boost node, without limitation)). When the voltage level exhibited by the voltage at the output node is higher than the voltage level exhibited by the voltage at the internal node of the charge pump cell, process 700b applies the voltage level at the output node to the bulk contact of the PMOS charge transfer transistor.

Notably, in one or more examples the operations of process 700a-700d may be performed at both NMOS and PMOS charge transfer transistors (e.g., NMOS charge transfer transistor M1 of FIG. 3 and FIG. 4 and PMOS charge transfer transistor M4 of FIG. 5 and FIG. 6, respectively) of a charge pump cell during power ON of the charge pump cell as discussed herein.

In some use cases of a disclosed charge pump cell and charge pumps including the same, a load (e.g., an instantaneous load current or variance of load current caused by a load) on an output node of a charge pump cell may be such that the output voltage $V_{OUT}$ does not reliably exhibit a voltage level that is $(S+1)*V_{IN}$. One or more examples relate, generally to a charge pump cell having a regulated output voltage.

Figure 8:
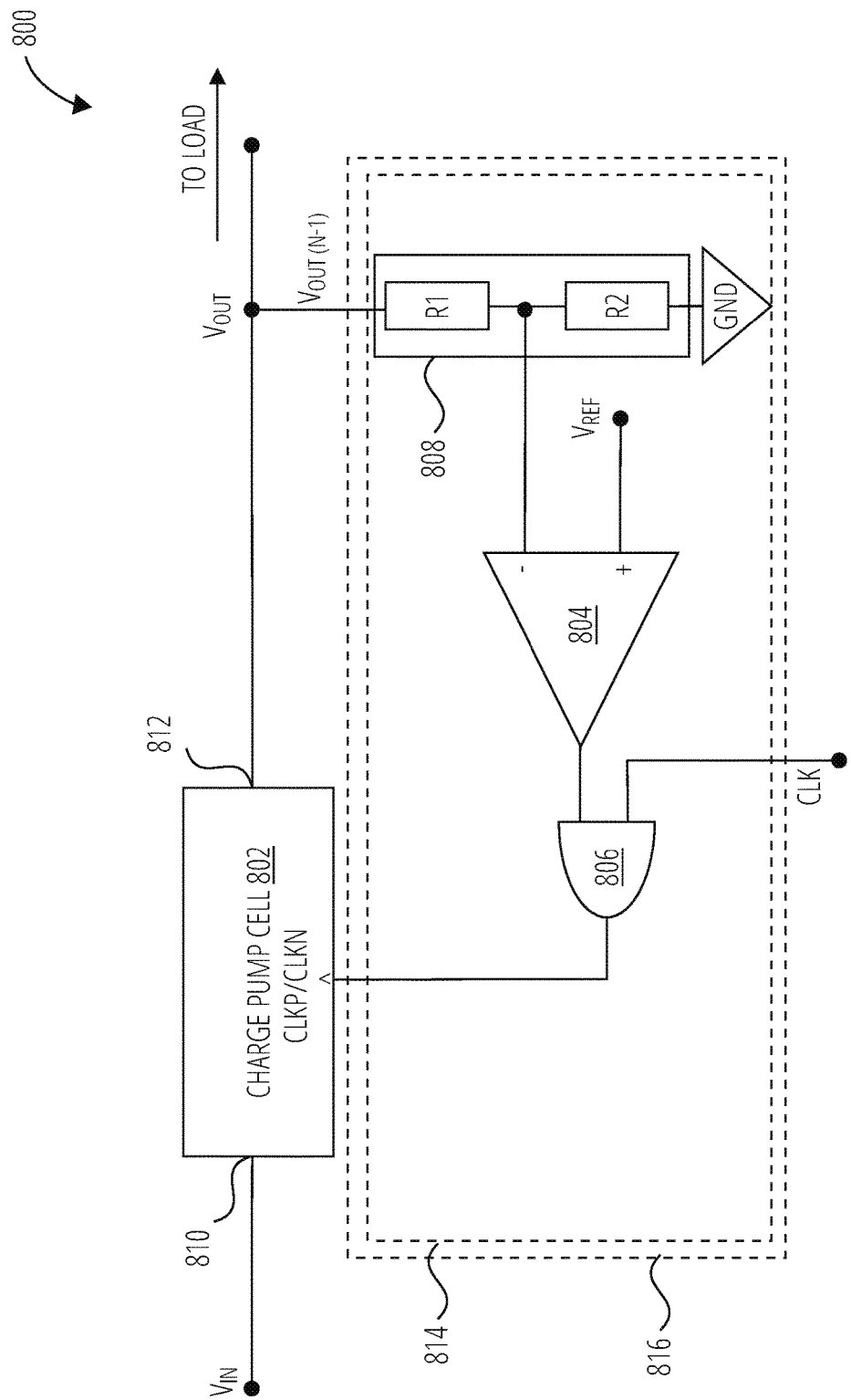
FIG. 8 is a diagram depicting a charge pump cell circuit having a regulated output voltage, in accordance with one or more examples.

FIG. 8 is a diagram depicting a charge pump cell circuit 800 having a regulated output voltage, in accordance with one or more examples. Charge pump cell circuit 800 includes charge pump cell 802 (e.g., charge pump cell 300 or 500, without limitation) and control loop 816 arranged to control a voltage level exhibited by output voltage $V_{OUT}$. In the specific non-limiting example depicted by FIG. 8, control loop 816 includes a resistive voltage divider 808, a comparator 804, and a gate 806 (also referred to herein as "AND gate 806") arranged in a negative feedback loop 814 arranged between output node 812 and respective inputs for pumping signals CLKP and CLKN at charge pump cell 802 (delay circuit for phase shifting CLKP or CLKN, as the case may be, not depicted).

Generally, negative feedback loop 814 is configured to regulate the output voltage $V_{OUT}$ to a reliably constant voltage level expressed as $V_{REF}*(R1+R2)/R2$, where R1 and R2 represent the respective resistances of the resistors in the resistive voltage divider 808. Accordingly, a relationship of a voltage level of output voltage $V_{OUT}$ and input voltage Vin at input node 810 is at least partially based on a pre-determined voltage level of reference voltage $V_{REF}$ and pre-determined respective resistances R1 and R2, and is not influenced by a load current on output node 812. By way of a non-limiting example where the resistances R1 and R2 are set to be the same, in response to ½ $V_{OUT\ (N-1)}$ ($V_{OUT\ (N-1)}$ is used herein to denote a state of voltage output $V_{OUT}$ provided to control loop 816) being below $V_{REF}$, comparator 804 is configured to output a logic "1." AND gate 806 is configured as a Boolean AND operator. When AND Gate 806 receives a logic "1" from comparator 804 the waveform at its output will substantially track the waveform of oscillating signal CLK, the source of the pumping signals CLKN and CLKP at charge pump cell 802, as a non-limiting example, a square wave generated by a clock source of a digital circuit. In one or more examples, oscillating signal CLK may exhibit a frequency at least partially based on desired frequencies of pumping signals CLKN and CLKP as discussed above. As non-limiting examples, oscillating signal CLK may exhibit a substantially same frequency as a frequency for CLKN and CLKP or a frequency that is a multiple of a frequency for CLKN and CLKP.

While ½ $V_{OUT\ (N-1)}$ is below $V_{REF}$, the source for the pumping signals CLKP and CLKN is effectively ON and the pumping signals are supplied to charge pump cell 802. In one or more examples, the waveform of pumping signals CLKP and CLKN track the waveform of CLK in terms of the frequency, and the waveform of one of CLKP and CLKN may be in substantially the same phase as CLK and the waveform of the other one of CLKP and CLKN is substantially 180° phase shifted to the waveform of CLK. Phase and frequency relationship between CLKP/CLKN and CLK may vary from examples discussed herein without exceeding the scope of this disclosure. For example, in some implementations a respective waveforms of CLKN and CLKP may exhibit a frequency that is derived from a frequency of CLK (e.g., via a frequency divider, without limitation), or one the waveforms of CLKN or CLKP may be phase shifted from a phase of CLK and the other waveform of CLKN and CLKP may be substantially 180° phase shifted therefrom.

In response to ½ $V_{OUT\ (N-1)}$ exceeding $V_{REF}$, comparator 804 is configured to output a logic "0." When AND gate 806 receives a logic "0" from comparator 805 the waveform at its output will be a logic "0" that does not oscillate. While ½ $V_{OUT\ (N-1)}$ is equal to or exceeds $V_{REF}$ pumping signals CLKP and CLKN are effectively turned OFF and no source is supplied to charge pump cell 802. When the pumping signals are OFF, charge pump cell 802 does not boost $V_{IN}$ to supply charge to output node 812, and the voltage level of output voltage $V_{OUT}$ decreases as $V_{OUT}$ is pulled down by a load current (load current not depicted). When ½ $V_{OUT\ (N-1)}$ falls to below $V_{REF}$, comparator 804 generates an output "1" which effectively turns on the pumping signals CLKN and CLKP and charge pump cell 802 provides charge to the output node 812 so the voltage level of output voltage $V_{OUT}$ increases. With periodic operation with ON/OFF, a balance is reached where average ½ $V_{OUT\ (N-1)}$ is substantially equal to $V_{REF}$ and output voltage $V_{OUT}$ is regulated to a desired voltage level for output voltage.

Figure 9:
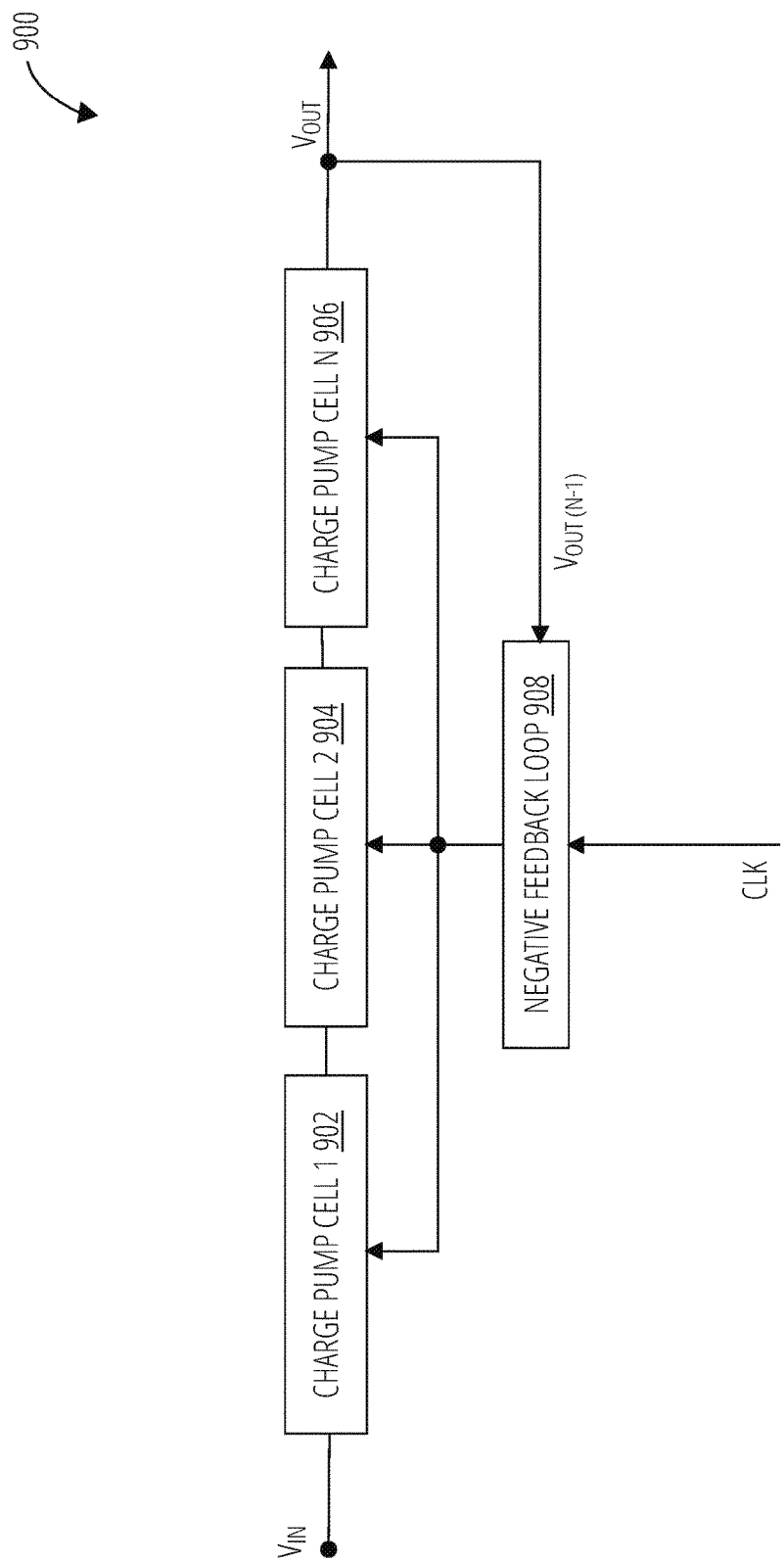
FIG. 9 is a diagram depicting an example topology for regulating voltage outputs of charge pumps and charge pump cells, in accordance with one or more examples.
Figure 10:
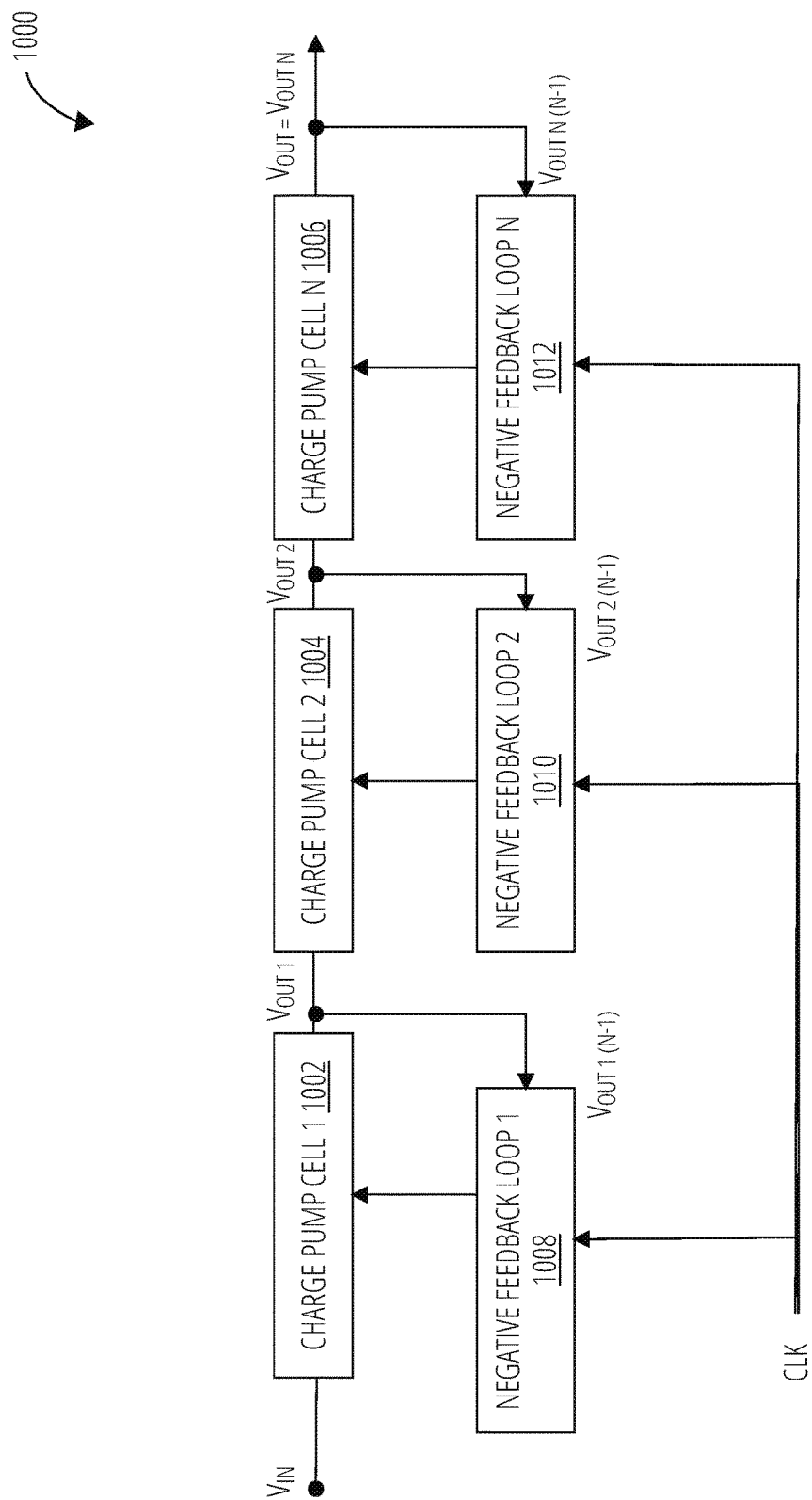
FIG. 10 is a diagram depicting an example topology for regulating voltage outputs of charge pumps and charge pump cells, in accordance with one or more examples.

A person having ordinary skill in the art will appreciate that many topologies are available for disclosed charge pump cells and charge pumps having regulated outputs. FIG. 9 and FIG. 10 are schematic diagrams depicting example topologies for regulating voltage outputs of charge pumps and charge pump cells, in accordance with one or more examples.

In the example topology depicted by FIG. 9, 1 to N charge pump cells 902, 904 and 906 (e.g., each a charge pump cell 300 or 500, without limitation) of a charge pump 900 are controlled by negative feedback loop 908 (e.g., negative feedback loop 814, without limitation) to regulate a voltage output $V_{OUT}$ of charge pump 900. While FIG. 9 depicts a control action executed at each of the 1 to N charge pump cells 902, 904, and 906, in one or more examples, negative feedback loop 908 may be configured or arranged to perform a control action at any number from 1 to a totality of N charge pump cells 902, 904, and 906 (e.g., at least one of the charge pump cells, without limitation).

In the example topology depicted by FIG. 10, 1 to N charge pump cells 1002, 1004, and 1006 of charge pump 1000 are individually controlled by 1 to N negative feedback loops 1008, 1010, and 1012, respectively to regulate the respective voltage outputs of the 1-N charge pump cells 1002, 1004 and 1006. Notably, in the topology depicted by FIG. 10, multiple regulated output voltages may be obtained at voltage outputs of respective 1 to N charge pump cells 1002, 1004 and 1006, at substantially the same time.

Figure 11:
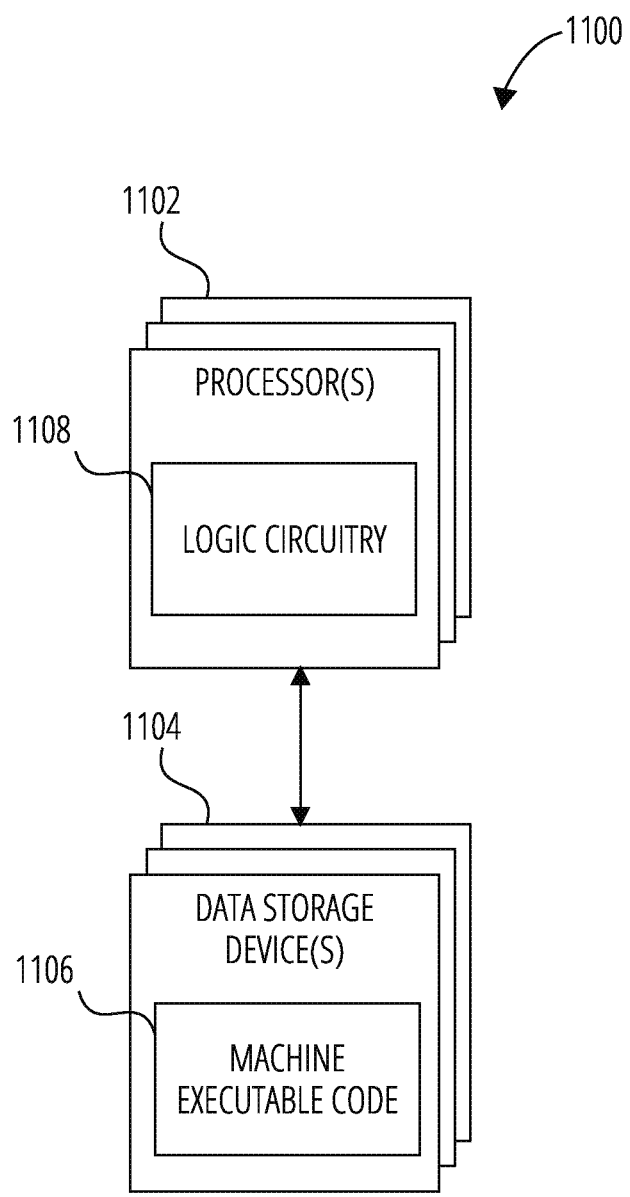
FIG. 11 is a block diagram depicting a circuitry for performing some or a totality of the features or elements of disclosed for one or more examples.

FIG. 11 is a block diagram of circuitry 1100 that, in some examples, may be used to implement various functions, operations, acts, processes, and/or methods disclosed herein. The circuitry 1100 includes one or more processors (sometimes referred to herein as "processors 1102") operably coupled to one or more data storage devices (sometimes referred to herein as "storage 1104"). The storage 1104 includes machine-executable code 1106 stored thereon and the processors 1102 include logic circuitry 1108. The machine-executable code 1106 includes information describing functional elements that may be implemented by (e.g., performed by) the logic circuitry 1108. The logic circuitry 1108 is adapted to implement (e.g., perform) the functional elements described by the machine-executable code 1106. The circuitry 1100, when executing the functional elements described by the machine-executable code 1106, should be considered as special purpose hardware configured for carrying out functional elements disclosed herein. In some examples the processors 1102 may be configured to perform the functional elements described by the machine-executable code 1106 sequentially, concurrently (e.g., on one or more different hardware platforms), or in one or more parallel process streams.

When implemented by logic circuitry 1108 of the processors 1102, the machine-executable code 1106 is configured to adapt the processors 1102 to perform operations of examples disclosed herein. For example, the machine-executable code 1106 may be configured to adapt the processors 1102 to perform at least a portion or a totality of the blocks and processes depicted by FIGS. 3 to 10. As another example, the machine-executable code 1106 may be configured to adapt the processors 1102 to perform at least a portion or a totality of the operations discussed for a disclosed charge transfer switch, charge pump cell, or charge pump.

As a specific, non-limiting example, the machine-executable code 1106 may be configured to adapt the processors 1102 to perform a process for operating a disclosed charge transfer switch, charge pump cell, or charge pump, including without limitation, process 700a-700d.

The processors 1102 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute functional elements corresponding to the machine-executable code 1106 (e.g., software code, firmware code, hardware descriptions) related to examples of the present disclosure. It is noted that a general-purpose processor (may also be referred to herein as a host processor or simply a host) may be a microprocessor, but in the alternative, the processors 1102 may include any conventional processor, controller, microcontroller, or state machine. The processors 1102 may also be implemented as a combination of computing devices, such as a combination of a DSP and a microprocessor, a plurality of microprocessors, one or more microprocessors in conjunction with a DSP core, or any other such configuration.

In some examples the storage 1104 includes volatile data storage (e.g., random-access memory (RAM)), non-volatile data storage (e.g., Flash memory, a hard disc drive, a solid state drive, erasable programmable read-only memory (EPROM), without limitation). In various examples, the processors 1102 and the storage 1104 may be implemented into a single device (e.g., a semiconductor device product, a system-on-chip (SOC), or a system-basis-chip, without limitation). In various examples the processors 1102 and the storage 1104 may be implemented into separate devices.

In various examples the machine-executable code 1106 may include computer-readable instructions (e.g., software code, firmware code). By way of non-limiting example, the computer-readable instructions may be stored by the storage 1104, accessed directly by the processors 1102, and executed by the processors 1102 using at least the logic circuitry 1108. Also by way of non-limiting example, the computer-readable instructions may be stored on the storage 1104, transferred to a memory device (not shown) for execution, and executed by the processors 1102 using at least the logic circuitry 1108. Accordingly, in various examples the logic circuitry 1108 includes electrically configurable logic circuitry 1108.

In various examples the machine-executable code 1106 may describe hardware (e.g., circuitry) to be implemented in the logic circuitry 1108 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, Verilog™, System-Verilog™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 1108 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in various examples the machine-executable code 1106 may include an HDL, an RTL, a GL description, a mask level description, other hardware description, or any combination thereof.

In examples where the machine-executable code 1106 includes a hardware description (at any level of abstraction), a system (not shown), but including the storage 1104 may be configured to implement the hardware description described by the machine-executable code 1106. By way of non-limiting example, the processors 1102 may include a programmable logic device (e.g., an FPGA or a PLC) and the logic circuitry 1108 may be electrically controlled to implement circuitry corresponding to the hardware description into the logic circuitry 1108. Also by way of non-limiting example, the logic circuitry 1108 may include hard-wired logic manufactured by a manufacturing system (not shown, but including the storage 1104) according to the hardware description of the machine-executable code 1106.

Regardless of whether the machine-executable code 1106 includes computer-readable instructions or a hardware description, the logic circuitry 1108 is adapted to perform the functional elements described by the machine-executable code 1106 when implementing the functional elements of the machine-executable code 1106. It is noted that although a hardware description may not directly describe functional elements, a hardware description indirectly describes functional elements that the hardware elements described by the hardware description are capable of performing.

A person having ordinary skill in the art will appreciate many advantages and benefits from various examples of charge pump cells disclosed herein. As non-limiting examples:

(1) A parasitic PNP BJT never (i.e., inconsequentially if ever) conducts at a disclosed charge transfer switch of the NMOS variety as the Emitter (P-well) and Base (deep N-well) are coupled to exhibit a same voltage level. Although a deep N-well is forced to exhibit the lowest voltage level of the charge pump cell, there is no opportunity for a parasitic PNP BJT to conduct when the voltage levels at its Emitter and Base are the same. Accordingly, no leakage current is injected by a parasitic PNP BJT to a P substrate of the disclosed charge transfer switch.

(2) The P-well is set to the lowest voltage level by a voltage selector (arrangement of M2, M3). In the P-well, the diode where the P-well is the Anode cannot conduct as the voltage at its Anode is always lower than a voltage at its Cathode (N region of Drain D1). Accordingly, no (i.e., an inconsequential amount if any) leakage current flows through the P-well.

Any characterization in this description of something as "typical," "conventional," "known," or the like does not necessarily mean that it is disclosed in the prior art or that the discussed aspects are appreciated in the prior art. Nor does it necessarily mean that, in the relevant field, it is widely known, well-understood, or routinely used. It only means that it known to or appreciated by the inventors of this disclosure.

As used in the present disclosure, the term "combination" with reference to a plurality of elements may include a combination of all the elements or any of various different sub combinations of some of the elements. For example, the phrase "A, B, C, D, or combinations thereof" may refer to any one of A, B, C, or D; the combination of each of A, B, C, and D; and any sub combination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims, without limitation) are generally intended as "open" terms (e.g., the term "including" should be interpreted as "including, but not limited to," the term "having" should be interpreted as "having at least," the term "includes" should be interpreted as "includes, but is not limited to," without limitation). As used herein, the term "each" means some or a totality. As used herein, the term "each and every" means a totality.

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more," without limitation); the same holds true for the use of definite articles used to introduce claim recitations. As used herein, the term "each" means some or a totality, and the term "each and every" means a totality.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations, without limitation). Furthermore, in those instances where a convention analogous to "at least one of A, B, and C, without limitation" or "one or more of A, B, and C, without limitation" is used, in general such a construction is intended to include A alone, B alone, C alone, A and B together, A and C together, B and C together, or A, B, and C together, without limitation.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Various examples of non-limiting examples of the disclosure include:

Example 1: a device, comprising: a CMOS structure; a first transistor provided at the CMOS structure; and a circuit arranged to apply a shield voltage to a bulk contact of the first transistor at least partially responsive to a relationship between a voltage at a first terminal of the first transistor and a voltage at a second terminal of the first transistor.

Example 2: the device according to Example 1, wherein the circuit is configured to apply the shield voltage exhibiting a lower of a voltage level exhibited by the voltage at the first terminal and a voltage level exhibited by the voltage at the second terminal.

Example 3: the device according to any of Examples 1 and 2, wherein the circuit comprises a second transistor provided at the CMOS structure and a third transistor provided at the CMOS structure.

Example 4: the device according to any of Examples 1 through 3, wherein the second transistor is arranged to turn ON at least partially responsive to the voltage at the second terminal exhibiting a higher voltage level than a voltage level exhibited by the voltage at the first terminal, and to turn OFF at least partially responsive to the voltage at the first terminal exhibiting a higher voltage level than the voltage level exhibited by the voltage at the second terminal.

Example 5: the device according to any of Examples 1 through 4, wherein the third transistor is arranged to turn ON at least partially responsive to the voltage at the first terminal exhibiting a higher voltage level than a voltage level exhibited by the voltage at the second terminal, and to turn OFF at least partially responsive to the voltage at the second terminal exhibiting a higher voltage level than the voltage level exhibited by the voltage at the second terminal.

Example 6: the device according to any of Examples 1 through 5, wherein the first and second terminals of the first transistor are a drain and a source of the first transistor, respectively.

Example 7: the device according to any of Examples 1 through 6, wherein a drain of the second transistor and the bulk contact of the first transistor are electrically coupled and a gate of the second transistor and the source of the first transistor are electrically coupled.

Example 8: the device according to any of Examples 1 through 7, wherein a drain of the third transistor and the bulk contact of the first transistor are electrically coupled and a gate of the third transistor and the drain of the first transistor are electrically coupled.

Example 9: the device according to any of Examples 1 through 8, wherein the second transistor is arranged to turn ON at least partially responsive to a voltage at the second terminal exhibiting a higher voltage level than a voltage level exhibited by a voltage at the first terminal, and to turn OFF at least partially responsive to the voltage at the first terminal exhibiting a higher voltage level than the voltage level exhibited by the voltage at the second terminal.

Example 10: the device according to any of Examples 1 through 9, wherein the third transistor is arranged to turn ON at least partially responsive to a voltage at the first terminal exhibiting a higher voltage level than a voltage level exhibited by a voltage at the second terminal, and to turn OFF at least partially responsive to the voltage at the second terminal exhibiting a higher voltage level than the voltage level exhibited by the voltage at the first terminal.

Example 11: the device according to any of Examples 1 through 10, wherein the CMOS structure comprises a N-well and a P-substrate, and the bulk contact is electrically coupled to the N-well.

Example 12: the device according to any of Examples 1 through 11, wherein the CMOS structure comprises a P-well, a deep N-well and a P-substrate, and the bulk contact is electrically coupled to the P-well and to the deep N-well.

Example 13: the device according to any of Examples 1 through 12, wherein the circuit is configured to apply the shield voltage exhibiting a higher of a voltage level exhibited by the voltage at the first terminal and a voltage level exhibited by the voltage at the second terminal.

Example 14: a method, comprising: providing an input voltage to an input node of a charge pump cell; and applying a shield voltage to a bulk contact of a charge transfer transistor at least partially responsive to a relationship between a voltage at a first terminal of the charge transfer transistor and a voltage at a second terminal of the charge transfer transistor.

Example 15: the method according to Example 14, comprising: applying the shield voltage to the bulk contact of the charge transfer transistor exhibiting a first voltage level at least partially responsive to a first relationship between the voltage at the first terminal of the charge transfer transistor and the voltage at the second terminal of the charge transfer transistor; and applying the shield voltage to the bulk contact of the charge transfer transistor exhibiting a second voltage level at least partially responsive to a second relationship between the voltage at the first terminal of the charge transfer transistor electrically coupled to the input node of the charge pump cell and the voltage at the second terminal of the charge transfer transistor electrically coupled to the internal node of the charge pump cell, wherein the first terminal of the charge transfer transistor is electrically coupled to an internal node of the charge pump cell, and wherein the second terminal of the charge transfer transistor is electrically coupled to the input node of the charge pump cell.

Example 16: the method according to any of Examples 14 and 15, comprising: observing the first relationship at least partially responsive to a voltage level exhibited by the voltage at the first terminal of the charge pump cell being lower than a voltage level exhibited by the voltage at the second terminal of the charge pump cell.

Example 17: the method according to any of Examples 14 through 16, comprising: observing the second relationship at least partially responsive to a voltage level exhibited by the voltage at the second terminal of the charge pump cell being lower than a voltage level exhibited by the voltage at the first terminal of the charge pump cell.

Example 18: the method according to any of Examples 14 through 17, the method comprising: applying the shield voltage to the bulk contact of the charge transfer transistor exhibiting a first voltage level at least partially responsive to a first relationship between a voltage at the first terminal of the charge transfer transistor and a voltage at a second terminal of the charge transfer transistor; and applying the shield voltage to the bulk contact of the charge transfer transistor exhibiting a second voltage level at least partially responsive to a second relationship between the voltage at the first terminal of the charge transfer transistor electrically coupled to the output node of the charge pump cell and the voltage at the second terminal of the charge transfer transistor electrically coupled to the internal node of the charge pump cell, wherein the first terminal of the charge transfer transistor is electrically coupled to an output node of the charge pump cell, and wherein the second terminal of the charge transfer transistor is electrically coupled to an internal node of the charge pump cell.

Example 19: the method according to any of Examples 14 through 18, comprising: observing the first relationship at least partially responsive to a voltage level exhibited by the voltage at the second terminal of the charge pump cell being higher than a voltage level exhibited by the voltage at the first terminal of the charge pump cell.

Example 20: the method according to any of Examples 14 through 19, comprising: observing the second relationship at least partially responsive to a voltage level exhibited by the voltage at the first terminal of the charge pump cell being higher than a voltage level exhibited by the voltage at the second terminal of the charge pump cell.

Example 21: a device, comprising: a charge pump; and a control loop configured to regulate an output voltage of the charge pump, wherein the charge pump includes at least one charge transfer switch comprising: a CMOS structure; a first transistor provided at the CMOS structure; and a circuit arranged to apply a voltage to a bulk contact of the first transistor responsive to a relationship between a voltage at a first terminal of the first transistor and a voltage at a second terminal of the first transistor.

Example 22: the device according to Example 21, wherein the control loop comprises a negative feedback loop configured to regulate the output voltage of the charge pump by controlling a pumping signal responsive to which the charge pump is configured to operate.

Example 23: the device according to any of Examples 21 and 22, wherein the charge pump comprises at least one charge pump cell and the control loop is configured to regulate the output voltage of the at least one charge pump cell by controlling a pumping signal responsive to which the at least one charge pump cell is configured to operate.

Example 24: the device according to any of Examples 21 through 23, wherein the control loop is configured to control the pumping signal at least partially responsive to an observed output voltage of the at least one charge pump cell.

Example 25: the device according to any of Examples 21 through 24, wherein the control loop is configured to control the pumping signal at least partially responsive to an observed output voltage of the charge pump.

Example 26: the device according to any of Examples 21 through 25, wherein the charge pump comprises two or more charge pump cells and the control loop comprises two or more negative feedback loops that are individually configured to regulate respective output voltages of the two or more charge pump cells by controlling pumping signals responsive to which the two or more charge pump cells are configured to operate.

Example 27: the device according to any of Examples 21 through 26, wherein the control loop is configured to control the pumping signal at least partially responsive to states of output voltages of respective ones of the two or more charge pump cells.

The features of the various examples described herein are not mutually exclusive and can exist in various combinations and permutations, even if such combinations or permutations are not expressly described herein, without departing from the scope of the disclosure. In fact, variations, modifications, and other implementations of what is described herein will occur to one of ordinary skill in the art without departing from the scope of the disclosure. As such, the invention is not to be defined only by the preceding illustrative description, but only by the claims which follow, and legal equivalents thereof.

What is claimed is:

1. A device, comprising:
   a first transistor;
   an output node electrically coupled to a first terminal of the first transistor, wherein the output node is unconnected to ground;
   a boost node coupled with a second terminal of the first transistor to boost a charge for transfer from the boost node to the output node via the first transistor;
   a circuit arranged to apply a shield voltage to a bulk contact of the first transistor at least partially responsive to a relationship between a voltage at the first terminal of the first transistor and a voltage at the second terminal of the first transistor;
   a further first transistor, wherein the ungrounded output node electrically coupled to a first terminal of the further first transistor;
   a further boost node coupled with a second terminal of the further first transistor to boost a charge for transfer from the further boost node to the ungrounded output node via the further first transistor; and
   a further circuit arranged to apply a shield voltage to a bulk contact of the further first transistor at least partially responsive to a relationship between a voltage at the first terminal of the further first transistor and a voltage at the second terminal of the further first transistor,
   wherein the first transistor coupled to alternately turn ON or OFF at least partially responsive to a voltage at the further boost node,
   wherein the further first transistor coupled to alternately turn ON or OFF at least partially responsive to a voltage at the boost node.

2. The device of claim 1, wherein the circuit is to apply the shield voltage exhibiting a lower of a voltage level exhibited by the voltage at the first terminal of the first transistor and a voltage level exhibited by the voltage at the second terminal of the first transistor.

3. The device of claim 1, wherein the circuit comprises a second transistor and a third transistor; and wherein the further circuit comprises a further second transistor and a further third transistor.

4. The device of claim 3, wherein the second transistor is arranged to turn ON at least partially responsive to the voltage at the second terminal of the first transistor exhibiting a higher voltage level than a voltage level exhibited by the voltage at the first terminal of the first transistor, and to turn OFF at least partially responsive to the voltage at the first terminal of the first transistor exhibiting a higher voltage level than the voltage level exhibited by the voltage at the second terminal of the first transistor.

5. The device of claim 3, wherein the third transistor is arranged to turn ON at least partially responsive to the voltage at the first terminal of the first transistor exhibiting a higher voltage level than a voltage level exhibited by the voltage at the second terminal of the first transistor, and to turn OFF at least partially responsive to the voltage at the second terminal of the first transistor exhibiting a higher voltage level than the voltage level exhibited by the voltage at the first terminal of the first transistor.

6. The device of claim 3, wherein the first and second terminals of the first transistor are a drain and a source of the first transistor, respectively.

7. The device of claim 6, wherein a drain of the second transistor and the bulk contact of the first transistor are electrically coupled and a gate of the second transistor and the source of the first transistor are electrically coupled.

8. The device of claim 3, wherein a drain of the third transistor and the bulk contact of the first transistor are electrically coupled and a gate of the third transistor and the drain of the first transistor are electrically coupled.

9. The device of claim 3, wherein the further second transistor is arranged to turn ON at least partially responsive to the voltage at the second terminal of the further first transistor exhibiting a higher voltage level than a voltage level exhibited by the voltage at the first terminal of the further first transistor, and to turn OFF at least partially responsive to the voltage at the first terminal of the further first transistor exhibiting a higher voltage level than the voltage level exhibited by the voltage at the second terminal of the further first transistor.

10. The device of claim 3, wherein the further third transistor is arranged to turn ON at least partially responsive to the voltage at the first terminal of the further first transistor exhibiting a higher voltage level than a voltage level exhibited by the voltage at the second terminal of the further first transistor, and to turn OFF at least partially responsive to the voltage at the second terminal of the further first transistor exhibiting a higher voltage level than the voltage level exhibited by the voltage at the first terminal of the further first transistor.

11. The device of claim 1, wherein the first transistor and the further first transistor is provided at a CMOS structure and the CMOS structure comprises a N-well and a P-substrate, and the bulk contact is electrically coupled to the N-well.

12. The device of claim 1, wherein the circuit apply the shield voltage exhibiting a higher of a voltage level exhibited by the voltage at the first terminal of the first transistor and a voltage level exhibited by the voltage at the second terminal of the first transistor; and, wherein the further circuit to apply a shield voltage exhibiting a higher of a voltage level exhibited by the voltage at the first terminal of the further first transistor and a voltage level exhibited by the voltage at the second terminal of the further first transistor.

13. A method, comprising:
applying a shield voltage to a bulk contact of a charge transfer transistor at least partially responsive to a relationship between a voltage at a first terminal of the charge transfer transistor and a voltage at a second terminal of the charge transfer transistor, wherein the first terminal of the charge transfer transistor is electrically coupled with a first boost node of a charge pump cell and the second terminal of the charge transfer transistor is electrically coupled with to an output node of the charge pump cell, the output node unconnected to ground;
providing a first boosting charge at the first boost node of the charge pump cell;
applying a shield voltage to a bulk contact of a further charge transfer transistor at least partially responsive to a relationship between a voltage at a first terminal of the further charge transfer transistor and a voltage at a second terminal of the further charge transfer transistor, wherein the first terminal of the further charge transfer transistor is electrically coupled with a second boost node of the charge pump cell and the second terminal of the further charge transfer transistor is electrically coupled to the ungrounded output node of the charge pump cell;
providing a second boosting charge at the second boost node of the charge pump cell;
turning ON or OFF the charge transfer transistor at least partially responsive to a voltage at the first terminal of the further charge transfer transistor; and
turning ON or OFF the further charge transfer transistor at least partially responsive to a voltage at the first terminal of the charge transfer transistor.

14. The method of claim 13, comprising:
applying the shield voltage to the bulk contact of the charge transfer transistor exhibiting a first voltage level at least partially responsive to a first relationship between the voltage at the first terminal of the charge transfer transistor and the voltage at the second terminal of the charge transfer transistor; and
applying the shield voltage to the bulk contact of the charge transfer transistor exhibiting a second voltage level at least partially responsive to a second relationship between the voltage at the first terminal of the charge transfer transistor and the voltage at the second terminal of the charge transfer transistor electrically coupled to an internal node of the charge pump cell.

15. The method of claim 14, comprising:
observing the first relationship at least partially responsive to a voltage level exhibited by the voltage at the first terminal of the charge pump cell being lower than a voltage level exhibited by the voltage at the second terminal of the charge pump cell.

16. The method of claim 14, comprising:
observing the second relationship at least partially responsive to a voltage level exhibited by the voltage at the second terminal of the charge pump cell being lower than a voltage level exhibited by the voltage at the first terminal of the charge pump cell.

17. A device, comprising:
a charge pump; and
a control loop configured to regulate an output voltage of the charge pump, wherein the charge pump includes at least one charge transfer switch comprising:

a first transistor;
a first boost node coupled with a first terminal of the first transistor;
an output node electrically coupled to a second terminal of the first transistor, the output node unconnected to ground;
a circuit arranged to apply a shield voltage to a bulk contact of the first transistor responsive to a relationship between a voltage at the first terminal of the first transistor and a voltage at the second terminal of the first transistor;
a further first transistor, wherein a second boost node is coupled with a first terminal of the further first transistor and the ungrounded output node is electrically coupled to the second terminal of the further first transistor; and
a further circuit arranged to apply a shield voltage to a bulk contact of the further first transistor at least partially responsive to a relationship between a voltage at the first terminal of the further first transistor and a voltage at the second terminal of the further first transistor,
wherein the first transistor coupled to alternately turn ON or OFF at least partially responsive to a voltage at the second boost node, and
wherein the further first transistor coupled to alternately turn ON or OFF at least partially responsive to a voltage at the first boost node.

18. The device of claim 17, wherein the control loop comprises a negative feedback loop to regulate the output voltage of the charge pump based at least in part on a reference voltage and a resistive voltage divider.

19. The device of claim 17, wherein the charge pump comprises at least one charge pump cell, and wherein the control loop is to regulate the output voltage of the at least one charge pump cell by controlling respective inputs for a first pumping signal and a second pumping signal responsive to which the at least one charge pump cell is to operate.

20. The device of claim 19, wherein the control loop to control pumping signals at least partially responsive to an observed output voltage of the at least one charge pump cell.

21. The device of claim 19, wherein the control loop is to control the first pumping signal and the second pumping signal at least partially responsive to an observed output voltage of the charge pump.

22. The device of claim 17, wherein the charge pump comprises two or more charge pump cells and the control loop comprises two or more negative feedback loops that are individually configured to regulate respective output voltages of the two or more charge pump cells by controlling pumping signals responsive to which the two or more charge pump cells are configured to operate.

23. The device of claim 22, wherein the control loop to control the pumping signals at least partially responsive to states of output voltages of respective ones of the two or more charge pump cells.

24. A device, comprising:
a first transistor;
an output node coupled with a first terminal of the first transistor;
a boost node coupled with a second terminal of the first transistor to boost a charge for transfer from the boost node to the output node via the first transistor, wherein the first and second terminals of the first transistor are a drain and a source of the first transistor, respectively;
a circuit arranged to apply a shield voltage to a bulk contact of the first transistor at least partially responsive to a relationship between a voltage at the first terminal of the first transistor and a voltage at the second terminal of the first transistor, wherein the circuit comprises a second transistor and a third transistor, and wherein a drain of the second transistor and the bulk contact of the first transistor are electrically coupled and a gate of the second transistor and the source of the first transistor are electrically coupled;
a further first transistor, wherein the output node coupled with a first terminal of the further first transistor;
a further boost node coupled with a second terminal of the further first transistor to boost a charge for transfer from the further boost node to the output node via the further first transistor; and
a further circuit arranged to apply a shield voltage to a bulk contact of the further first transistor at least partially responsive to a relationship between a voltage at the first terminal of the further first transistor and a voltage at the second terminal of the further first transistor,
wherein the first transistor coupled to alternately turn ON or OFF at least partially responsive to a voltage at the further boost node,
wherein the further first transistor coupled to alternately turn ON or OFF at least partially responsive to a voltage at the boost node.

25. A device, comprising:
a first transistor;
an output node coupled with a first terminal of the first transistor;
a boost node coupled with a second terminal of the first transistor to boost a charge for transfer from the boost node to the output node via the first transistor;
a circuit arranged to apply a shield voltage to a bulk contact of the first transistor at least partially responsive to a relationship between a voltage at the first terminal of the first transistor and a voltage at the second terminal of the first transistor, wherein the circuit comprises a second transistor and a third transistor, and wherein a drain of the third transistor and the bulk contact of the first transistor are electrically coupled and a gate of the third transistor and the drain of the first transistor are electrically coupled;
a further first transistor, wherein the output node coupled with a first terminal of the further first transistor;
a further boost node coupled with a second terminal of the further first transistor to boost a charge for transfer from the further boost node to the output node via the further first transistor; and
a further circuit arranged to apply a shield voltage to a bulk contact of the further first transistor at least partially responsive to a relationship between a voltage at the first terminal of the further first transistor and a voltage at the second terminal of the further first transistor,
wherein the first transistor coupled to alternately turn ON or OFF at least partially responsive to a voltage at the further boost node,
wherein the further first transistor coupled to alternately turn ON or OFF at least partially responsive to a voltage at the boost node.

* * * * *

UNITED STATES PATENT AND TRADEMARK OFFICE
CERTIFICATE OF CORRECTION

| | | |
|---|---|---|
| PATENT NO. | : 12,395,076 B2 | Page 1 of 1 |
| APPLICATION NO. | : 18/152032 | |
| DATED | : August 19, 2025 | |
| INVENTOR(S) | : Lei Zou and Torbjoern Loevseth Finnoey | |

It is certified that error appears in the above-identified patent and that said Letters Patent is hereby corrected as shown below:

In the Claims

| | | | |
|---|---|---|---|
| Claim 12, | Column 23, | Line 62, | change "circuit apply the" to --circuit to apply the-- |
| Claim 13, | Column 24, | Line 13, | change "coupled with to an" to --coupled to an-- |

Signed and Sealed this
Third Day of February, 2026

John A. Squires
*Director of the United States Patent and Trademark Office*